(12) United States Patent
Manipatruni et al.

(10) Patent No.: US 12,671,420 B2
(45) Date of Patent: *Jun. 30, 2026

(54) METHOD OF FORMING A MAJORITY GATE BASED LOW POWER FERROELECTRIC BASED ADDER WITH RESET MECHANISM

(71) Applicant: Kepler Computing Inc., San Francisco, CA (US)

(72) Inventors: Sasikanth Manipatruni, Portland, OR (US); Yuan-Sheng Fang, Oakland, CA (US); Robert Menezes, Portland, OR (US); Rajeev Kumar Dokania, Beaverton, OR (US); Gaurav Thareja, Santa Clara, CA (US); Ramamoorthy Ramesh, Moraga, CA (US); Amrita Mathuriya, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/780,383

(22) Filed: Jul. 22, 2024

(65) Prior Publication Data

US 2024/0380403 A1 Nov. 14, 2024

Related U.S. Application Data

(63) Continuation of application No. 18/320,163, filed on May 18, 2023, now Pat. No. 12,088,297, which is a
(Continued)

(51) Int. Cl.
| | |
|---|---|
| *H03K 19/23* | (2006.01) |
| *G06F 7/501* | (2006.01) |
| *H10D 1/68* | (2025.01) |

(52) U.S. Cl.
CPC ............. *H03K 19/23* (2013.01); *G06F 7/501* (2013.01); *H10D 1/682* (2025.01); *H10D 1/694* (2025.01)

(58) Field of Classification Search
CPC ........ G06F 7/501; H03K 19/23; H10D 1/682; H10D 1/694
See application file for complete search history.

(56) References Cited

U.S. PATENT DOCUMENTS

| | | | |
|---|---|---|---|
| 3,260,863 | A | 7/1966 | Burns et al. |
| 3,524,977 | A | 8/1970 | Wang |

(Continued)

FOREIGN PATENT DOCUMENTS

| | | |
|---|---|---|
| JP | 2000156472 A | 6/2000 |
| KR | 20160089141 A | 7/2016 |
| WO | 2019005175 A1 | 1/2019 |

OTHER PUBLICATIONS

Notice of Allowance notified Oct. 1, 2021 for Taiwan Patent Application No. 109146061.
(Continued)

*Primary Examiner* — Alexander H Taningco
(74) *Attorney, Agent, or Firm* — MUGHAL GAUDRY & FRANKLIN PC

(57) ABSTRACT

An adder with first and second majority gates. For a 1-bit adder, output from a 3-input majority gate is inverted and input two times to a 5-input majority gate. Other inputs to the 5-input majority gate are same as those of the 3-input majority gate. The output of the 5-input majority gate is a sum while the output of the 3-input majority gate is the carry. Multiple 1-bit adders are concatenated to form an N-bit adder. The input signals are driven to first terminals of non-ferroelectric capacitors while the second terminals are coupled to form a majority node. Majority function of the input signals occurs on this node. The majority node is then
(Continued)

coupled to a first terminal of a non-linear polar capacitor. The second terminal of the capacitor provides the output of the logic gate. A reset mechanism initializes the non-linear polar capacitor before addition function is performed.

15 Claims, 24 Drawing Sheets

Related U.S. Application Data continuation of application No. 17/654,055, filed on Mar. 8, 2022, now Pat. No. 11,711,083, which is a continuation of application No. 17/129,800, filed on Dec. 21, 2020, now Pat. No. 11,283,453, which is a continuation-in-part of application No. 16/729,269, filed on Dec. 27, 2019, now Pat. No. 10,944,404.

(56)                    References Cited

U.S. PATENT DOCUMENTS

| | | | | |
|---|---|---|---|---|
| 4,761,760 | A | 8/1988 | Tomoji | |
| 5,381,352 | A | 1/1995 | Shou et al. | |
| 5,818,380 | A | 10/1998 | Ito et al. | |
| 5,835,045 | A * | 11/1998 | Ogawa | H03K 5/249 |
| | | | | 327/91 |
| 5,926,057 | A * | 7/1999 | Ogawa | G06F 7/00 |
| | | | | 327/359 |
| 5,937,399 | A * | 8/1999 | Ohmi | G06N 3/065 |
| | | | | 706/26 |
| 5,978,827 | A | 11/1999 | Ichikawa | |
| 6,043,675 | A | 3/2000 | Miyamoto | |
| 6,198,652 | B1 | 3/2001 | Kawakubo et al. | |
| 6,208,282 | B1 | 3/2001 | Miyamoto | |
| 6,407,442 | B2 | 6/2002 | Inoue et al. | |
| 6,505,226 | B1 | 1/2003 | Ahn | |
| 7,212,448 | B1 | 5/2007 | Trimberger | |
| 7,837,110 | B1 | 11/2010 | Hess et al. | |
| 7,897,454 | B2 | 3/2011 | Wang et al. | |
| 8,247,855 | B2 | 8/2012 | Summerfelt | |
| 8,571,159 | B1 | 10/2013 | Soh | |
| 9,276,040 | B1 | 3/2016 | Marshall et al. | |
| 9,324,405 | B2 | 4/2016 | Evans, Jr. et al. | |
| 9,697,882 | B1 | 7/2017 | Evans, Jr. et al. | |
| 9,858,979 | B1 | 1/2018 | Derner et al. | |
| 9,912,323 | B1 | 3/2018 | Ardalan | |
| 9,973,329 | B2 | 5/2018 | Hood et al. | |
| 10,164,618 | B1 | 12/2018 | Shi et al. | |
| 10,217,522 | B2 | 2/2019 | Wang et al. | |
| 10,622,050 | B2 | 4/2020 | El-Mansouri et al. | |
| 10,679,782 | B2 | 6/2020 | Manipatruni et al. | |
| 10,944,404 | B1 | 3/2021 | Manipatruni et al. | |
| 11,165,430 | B1 | 11/2021 | Manipatruni et al. | |
| 11,283,453 | B2 | 3/2022 | Manipatruni et al. | |
| 2001/0052619 | A1 | 12/2001 | Inoue et al. | |
| 2002/0185690 | A1 | 12/2002 | Ueda et al. | |
| 2004/0183508 | A1 | 9/2004 | Toyoda et al. | |
| 2008/0079459 | A1* | 4/2008 | Kawano | G06F 30/34 |
| | | | | 326/38 |
| 2015/0269478 | A1 | 9/2015 | Datta et al. | |
| 2015/0337983 | A1 | 11/2015 | Dolenti et al. | |
| 2017/0243917 | A1 | 8/2017 | Manipatruni et al. | |
| 2017/0337983 | A1 | 11/2017 | Wang et al. | |
| 2018/0076815 | A1 | 3/2018 | Vigeant et al. | |
| 2018/0240583 | A1 | 8/2018 | Manipatruni et al. | |
| 2019/0065151 | A1* | 2/2019 | Chen | G06F 17/16 |
| 2019/0074295 | A1 | 3/2019 | Schröder | |
| 2019/0318775 | A1 | 10/2019 | Rakshit et al. | |
| 2019/0348098 | A1 | 11/2019 | El-Mansouri et al. | |
| 2020/0065065 | A1* | 2/2020 | Wei | H03K 19/01742 |
| 2020/0091407 | A1 | 3/2020 | Liu et al. | |
| 2020/0091414 | A1* | 3/2020 | Liu | G11C 11/1675 |
| 2020/0210233 | A1 | 7/2020 | Chen et al. | |
| 2020/0258894 | A1 | 8/2020 | Lilak et al. | |
| 2021/0226636 | A1 | 7/2021 | Manipatruni et al. | |
| 2022/0271756 | A1 | 8/2022 | Fan et al. | |

OTHER PUBLICATIONS

Notice of Allowance notified Oct. 28, 2021 for Taiwan Patent Application No. 109146064.

Notice of Allowance notified Sep. 21, 2020 for U.S. Appl. No. 16/729,269.

Notice of Allowance notified Sep. 23, 2022 for U.S. Appl. No. 17/317,482.

Notice of Allowance notified Sep. 29, 2021 for TW Patent Application No. 109146061.

Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.

"Kepler Logic", Named for Amalie Emmy Noether @ https://en.wikipedia.org/wiki/Emmy_Noether. Downloaded from internet on Jan. 10, 2020.

Advisory Action notified Nov. 15, 2023 for U.S. Appl. No. 17/467,061.

Fichtner, S. et al., "AlScN: A III-V semiconductor based ferroelectric", Journal of Applied Physics 125, 114103 (2019); https://doi.org/10.1063/1.5084945, 2019, 28 pages.

Final Office Action notified Apr. 4, 2022 for U.S. Appl. No. 17/129,849.

Final Office Action notified Dec. 15, 2021 for U.S. Appl. No. 17/129,824.

Final Office Action notified Jul. 6, 2020 for U.S. Appl. No. 16/729,269.

Final Office Action notified Nov. 24, 2020 for U.S. Appl. No. 16/797,299.

Final Office Action notified Nov. 26, 2021 for U.S. Appl. No. 17/129,800.

Final Office Action notified Nov. 27, 2020 for U.S. Appl. No. 16/729,275.

Final Office Action notified Sep. 7, 2023 for U.S. Appl. No. 17/467,061.

First Office Action & Search Report notified Jun. 25, 2021 for Taiwan Patent Application No. 109146064.

First Office Action notified Jul. 7, 2021 for Taiwan Patent Application No. 109146061.

Hou et al., "Ultrahigh Energy Density in SrTiO3 Film Capacitors," ACS Appl. Mater. Interfaces 2017, 9, 24, 20484-20490 Publication Date: May 30, 2017, https://doi.org/10.1021/acsami. 7b02225, (7 pages).

International Preliminary Report on Patentability notified Jul. 7, 2022 for PCT Patent Application No. PCT/US2020/066961.

International Preliminary Report on Patentability notified Jul. 7, 2022 for PCT Patent Application No. PCT/US2020/066963.

International Search Report & Written Opinion notified Apr. 15, 2021 for U.S. Patent Application No. PCT/US2020/066961.

International Search Report & Written Opinion notified Apr. 22, 2021 for PCT Patent Application No. PCT/US2020/066963.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Muroga, S., Threshold Logic and Its Applications, Wiley-Interscience, a Division of John Wiley & Sons, Inc. New York, 1971. 8 page excerpt.

Navi et al., "Two novel ultra-high speed carbon nanotube Full-Adder cells," IEICE Electronics Express, vol. 6, No. 19, 1395-1401, doi : 10.1587/elex.6.1395. Publication date Oct. 10, 2009, (7 pages).

Non-Final Office Action notified Apr. 17, 2023 for U.S. Appl. No. 17/467,061.

Non-Final Office Action notified Apr. 22, 2020 for U.S. Appl. No. 16/729,275.

Non-Final Office Action notified Aug. 7, 2020 for U.S. Appl. No. 16/729,275.

Non-Final Office Action notified Aug. 11, 2020 for U.S. Appl. No. 16/796,824.

(56)         References Cited

OTHER PUBLICATIONS

Non-Final Office Action notified Aug. 13, 2020 for U.S. Appl. No. 16/797,299.

Non-Final Office Action notified Dec. 27, 2022 for U.S. Appl. No. 17/654,055.

Non-Final Office Action notified Feb. 21, 2024 for U.S. Appl. No. 18/056,243.

Non-Final Office Action notified Feb. 22, 2022 for U.S. Appl. No. 17/129,849.

Non-Final Office Action notified Jan. 12, 2024 for U.S. Appl. No. 17/467,061.

Non-Final Office Action notified Jun. 15, 2023 for U.S. Appl. No. 17/503,124.

Non-Final Office Action notified Mar. 27, 2020 for U.S. Appl. No. 16/729,269.

Non-Final Office Action notified Nov. 3, 2021 for U.S. Appl. No. 17/129,800.

Non-Final Office Action notified Nov. 24, 2020 for U.S. Appl. No. 16/796,824.

Non-Final Office Action notified Sep. 9, 2022 for U.S. Appl. No. 17/317,482.

Non-Final Office Action notified Sep. 16, 2021 for U.S. Appl. No. 17/129,824.

Notice of Allowance notified Apr. 14, 2022 for U.S. Appl. No. 17/129,849.

Notice of Allowance notified Aug. 9, 2023 for U.S. Appl. No. 17/503,124.

Notice of Allowance notified Dec. 3, 2021 for U.S. Appl. No. 17/129,830.

Notice of Allowance notified Dec. 21, 2021 for U.S. Appl. No. 17/129,800.

Notice of Allowance notified Feb. 3, 2021 for U.S. Appl. No. 16/729,275.

Notice of Allowance notified Feb. 5, 2020 for U.S. Appl. No. 16/796,824.

Notice of Allowance notified Feb. 23, 2024 for U.S. Appl. No. 18/320,163.

Notice of Allowance notified Jan. 29, 2020 for U.S. Appl. No. 16/797,299.

Notice of Allowance notified Jul. 15, 2022 for U.S. Appl. No. 17/183,181.

Notice of Allowance notified Jun. 5, 2024 for U.S. Appl. No. 17/467,061.

Notice of Allowance notified Jun. 21, 2024 for U.S. Appl. No. 18/056,243.

Notice of Allowance notified Mar. 2, 2022 for U.S. Appl. No. 17/129,821.

Notice of Allowance notified Mar. 31, 2023 for U.S. Appl. No. 17/654,055.

Notice of Allowance notified May 3, 2024 for U.S. Appl. No. 18/320,163.

Notice of Allowance notified Nov. 3, 2020 for U.S. Appl. No. 16/797,296.

* cited by examiner

130

METHOD OF FORMING A MAJORITY GATE BASED LOW POWER FERROELECTRIC BASED ADDER WITH RESET MECHANISM

CLAIM OF PRIORITY

This application is a Continuation of, and claims the benefit of priority to, U.S. patent application Ser. No. 18/320,163, filed May 18, 2023, and now issued as U.S. Pat. No. 12,088,297 on Sep. 10, 2024, and which is a Continuation of, and claims the benefit of priority to, U.S. patent application Ser. No. 17/654,055, filed Mar. 8, 2022, and now issued as U.S. Pat. No. 11,711,083 on Jul. 25, 2023, which is a Continuation of, and claims the benefit of priority to, U.S. patent application Ser. No. 17/129,800, filed Dec. 21, 2020, now issued as U.S. Pat. No. 11,283,453 on Mar. 22, 2022, which is a Continuation-In-Part (CIP) of U.S. patent application Ser. No. 16/729,269, filed Dec. 27, 2019, now issued as U.S. Pat. No. 10,944,404 on Mar. 9, 2021, and which are incorporated by reference in its entirety.

BACKGROUND

Typical 1-bit full adder receives three or more inputs, and may consist of several logic gates such as AND gate, OR, gate, XOR gates, inverters, and buffers. In complementary metal oxide semiconductor (CMOS) logic, a 2-input AND gate derived from a 2-input NAND gate and an inverter consists of six transistors. A 2-input OR gate derived from a 2-input NOR gate and an inverter consists of six transistors. A 2-input XOR gate may consist of at least six transistors. As the number of transistors increases, power consumption and area also increase. As devices are pushing down the power envelope to save battery power, existing circuit architecture for 1-bit full adder presents challenges to the goal of lower power consumption.

The background description provided here is for the purpose of generally presenting the context of the disclosure. Unless otherwise indicated here, the material described in this section is not prior art to the claims in this application and are not admitted as prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
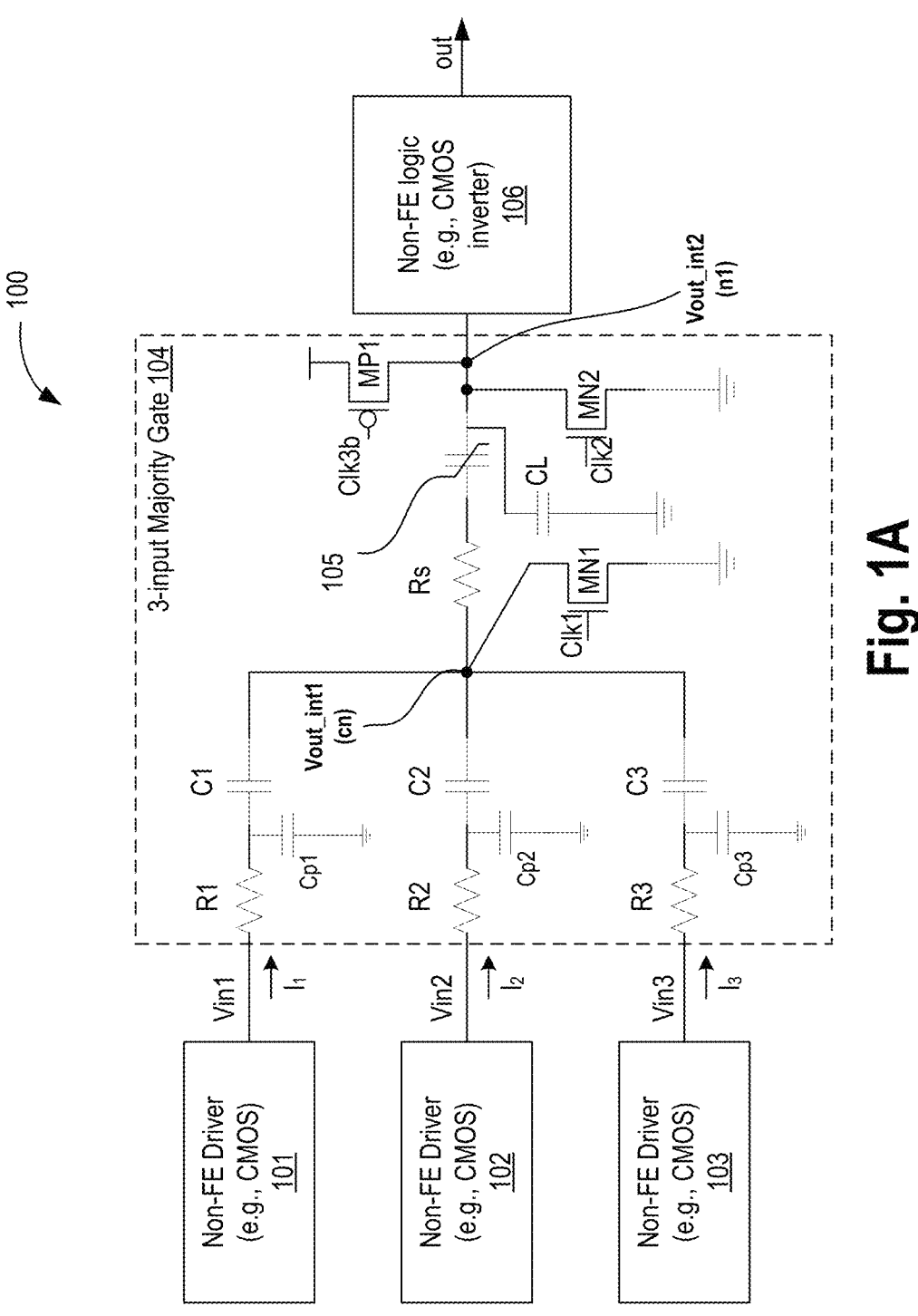
FIG. 1A illustrates a logic gate with a 3-input majority gate, in accordance with some embodiments.

In various embodiments, an adder is derived from first and second majority gates. A full adder adds binary numbers. A one-bit full-adder adds three one-bit numbers, A, B, and $C_{in}$, where A and B are the operands, and $C_{in}$ is a carry-in bit which is carried in from a previous, less-significant stage. A full adder is usually derived as a cascade of adders. These adders add, for example, 8, 16, 32, etc., bit binary numbers. The output of a 1-bit full adder circuit produces a 2-bit output. One of the output bits is a carry output and other output bit is a sum. The carry is typically represented by signal $C_{in}$ while the sum is typically represented by signal S, where the sum equals $2C_{out}+S$. Implementing a 1-bit adder requires many logic gates such as AND logic gate, OR logic gate, inverters, and sometime state elements such as flip-flops.

Some embodiments describe a new class of logic gates that use non-linear polar material. These new class of logic gates become the basis of a 1-bit full adder. The logic gates include multi-input majority gates and threshold gates. Input signals in the form of digital signals, analog, digitals, or a combination of them are driven to first terminals of non-ferroelectric capacitors. The second terminals of the non-ferroelectric capacitors are coupled to form a majority node. Majority function of the input signals occurs on this node. The majority node is then coupled to a first terminal of a capacitor comprising non-linear polar material. The second terminal of the capacitor provides the output of the logic gate, which can be driven by any suitable logic gate such as a buffer, an inverter, an NAND gate, an NOR gate, etc. Any suitable logic or analog circuit can drive the outputs and inputs of the majority logic gate. As such, the majority gate of various embodiments can be combined with existing transistor technologies such as complementary metal oxide semiconductor (CMOS), tunneling field effect transistor (TFET), GaAs based transistors, bipolar junction transistors (BJTs), Bi-CMOS transistors, etc.

In some embodiments, a 1-bit adder is implemented using a 3-input majority gate and a 5-input majority gate. An output from the 3-input majority gate is inverted and input two times to the 5-input majority gate. Other inputs to the 5-input majority gate are same as those of the 3-input majority gate. The output of the 5-input majority gate is a sum while the output of the 3-input majority gate is the carry. Multiple 1-bit adders are concatenated to form an N-bit adder.

In some embodiments, an additional fixed or program-mable input is coupled to the majority node via a capacitor. This additional fixed or programmable input can be a positive or negative bias. The bias behaves as a threshold or offset added or subtracted to or from the voltage (or current) on the majority node and determines the final logic value of the logic gate. Depending on the polarity or voltage value of the bias, AND gate or OR logic gate functions are realized, in accordance with various embodiments.

There are many technical effects of the various embodi-ments. For example, extremely compact basic logic gates are formed using the non-ferroelectric capacitors and a capacitor with non-linear polar material. The non-linear polar material can be a ferroelectric material, a paraelectric material, or a non-linear dielectric. The logic gates become the basis of adders, multipliers, sequential circuits, and other complex circuits, etc. The majority gate and threshold gate of various embodiments lowers the power consumption because they do not use switching transistors and the interconnect rout-ings are much fewer than the interconnect routings used in transitional CMOS logic gates. For example, 10× fewer interconnect length is used by the majority gate and thresh-old gate of various embodiments than traditional CMOS circuits for the same function and performance. The capaci-tor with non-linear polar material provides non-volatility that allows for intermittent operation.

For example, a processor having such logic gates can enter and exit various types of low power states without having to worry about losing data. Since the capacitor with non-linear polar material can store charge from low energy devices, the entire processor can operate at much lower voltage level from the power supply, which reduces overall power of the processor. Further, very low voltage switching (e.g., 100 mV) of the non-linear polar material state allows for low swing signal switching, which in turn results in low power.

The capacitor with non-linear polar material can be used with any type of transistor. For example, the capacitor with non-linear polar material of various embodiments can be used with planar or non-planar transistors. The transistors can be formed in the frontend or backend of a die. The capacitors with non-linear polar material can be formed in the frontend or backend of the die. As such, the logic gates can be packed with high density compared to traditional logic gates. Adders are basic building blocks in processors. The majority gate based adders of various embodiments are orders of magnitude smaller than a typical CMOS adder. This allows for implementing adders to add very large numbers at very low power and with small area. The non-volatility of the outputs also makes the adder of various embodiments ideal for low power applications. Other tech-nical effects will be evident from the various embodiments and figures.

In the following description, numerous details are dis-cussed to provide a more thorough explanation of embodi-ments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodi-ments, signals are represented with lines. Some lines may be thicker, to indicate more constituent signal paths, and/or have arrows at one or more ends, to indicate primary information flow direction. Such indications are not intended to be limiting. Rather, the lines are used in con-nection with one or more exemplary embodiments to facili-tate easier understanding of a circuit or a logical unit. Any represented signal, as dictated by design needs or prefer-ences, may actually comprise one or more signals that may travel in either direction, and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connec-tion between the things that are connected or an indirect connection, through one or more passive or active interme-diary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to coop-erate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" may generally refer to any continuous signal for which the time varying feature (variable) of the signal is a representation of some other time varying quantity, e.g., analogous to another time varying signal.

Here, the term "digital signal" may generally refer to a physical signal that is a representation of a sequence of discrete values (a quantified discrete-time signal), for example of an arbitrary bit stream, or of a digitized (sample and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—e.g., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, a source, or a drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1A illustrates logic gate 100 with a 3-input majority gate, in accordance with some embodiments. Logic gate 100 comprises first, second, and third drivers 101, 102, and 103, respectively. These drivers can be analog drivers generating analog signals or digital drivers generating signals that toggle between ground and the power supply rail, or a combination of analog or digital drivers. For example, driver 101 is a CMOS driver such as a buffer, an inverter, an NAND gate, an NOR gate, etc., while driver 102 is an amplifier generating a bias signal. The drivers provide input signals Vin1 (and current $I_1$), Vin2 (and current $I_2$), and Vin3 (and current $I_3$) to the three inputs of 3-input majority gate 104.

In various embodiments, 3-input majority gate 104 comprises three input nodes Vin1, Vin2, and Vin3. Here, signal names and node names are interchangeably used. For example, Vin1 refers to node Vin1 or signal Vin1 depending on the context of the sentence. 3-input majority gate 104 further comprises capacitors C1, C2, and C3. Here, resistors R1, R2, and R3 are interconnected parasitic resistances coupled to capacitors C1, C2, and C3 respectively. In various embodiments, capacitors C1, C2, and C3 are non-ferroelectric capacitors. In some embodiments, the non-ferroelectric capacitor includes one of: a dielectric capacitor, a paraelectric capacitor, or a non-linear dielectric capacitor.

A dielectric capacitor comprises first and second metal plates with a dielectric between them. Examples of such dielectrics are: HfO, ABO3 perovskites, nitrides, oxy-fluorides, oxides, etc.

A paraelectric capacitor comprises first and second metal plates with a paraelectric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, La-substituted PbTiO3, and PMN-PT based relaxor ferroelectrics.

A dielectric capacitor comprises first and second metal plates with non-linear dielectric capacitor between them. The range for dielectric constant is 1.2 to 10000. The capacitors C1, C2, and C3 can be implemented as MIM (metal-insulator-metal) capacitor technology, transistor gate capacitor, hybrid of metal capacitors, or transistor capacitor. The capacitors C1, C2, and C3 can be implemented as MIM (metal-insulator-metal) capacitor technology, transistor gate capacitor, or hybrid of metal capacitors, or transistor capacitor.

One terminal of the capacitors C1, C2, and C3 is coupled to a common node cn. This common node is coupled to node n1, which is coupled to a first terminal of a non-linear polar capacitor 105. The majority function is performed at the common node cn, and the resulting voltage is projected on to capacitor 105. For example, the majority function of the currents ($I_1$, $I_2$, and $I_3$) on node cn results in a resultant current that charges capacitor 105. Table 1 illustrates the majority function f(Majority Vin1, Vin2, Vin3).

TABLE 1

| Vin1 | Vin2 | Vin3 | cn (f(Majority Vin1, Vin2, Vin3)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

A capacitor with FE material (also referred to as an FEC) is a non-linear capacitor with its potential $V_F(Q_F)$ as a cubic function of its charge. FIG. 1C illustrates plot 130 showing characteristics of a FEC. Plot 130 is a charge-voltage (Q-V) plot for a block f $Pb(Zr_{0.5}Ti_{0.5})O_3$ of area $(100 \text{ nm})^2$ and thickness 20 nm (nanometer). Plot 130 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

Referring back to FIG. 1A, in some embodiments, N odd number of capacitors are coupled to a single FEC to form a majority gate. In this case, N=3. The measured charge on the FEC ($Q_F$) is the output of the majority gate. Solving for a steady-state solution, the parasitic resistors are ignored and the input potentials $V_i$ (or Vin) are assumed to be constant. In this case, the charge across each linear capacitor (C1, C2, C3) is:

$$Q_i = C_i \cdot (V_i - V_F) \tag{1}$$

The charge summed at node Cn and across FEC 105 is express as:

$$Q_F = \sum_i Q_i \tag{2}$$

$$Q_F = \sum_i C_i V_i - \sum_i C_i V_F \tag{3}$$

$$Q_F = \sum_i C_i V_i - C V_F(Q_F) \tag{4}$$

$$V_F(Q_F) = \sum_i \frac{c_i}{c} V_i - \frac{Q_F}{c} \tag{5}$$

Here, $C=\Sigma_i C_i$ is the sum of the capacitances. In the limit, $C\rightarrow\infty$, the following is achieved:

$$V_F(Q_F) = \sum_i \frac{c_i}{c} V_i = \bar{V} \tag{6}$$

The potential across FEC 105 is the average of all the input potentials weighted by the capacitances (e.g., C1, C2, and C3).

When $C_i=C/N$ are all equal, $V_F$ is just a simple mean. To ensure that $$Q_F = V_F^{-1}(\bar{V}) \tag{7}$$

is well defined, all possible values of $\nabla$ have magnitudes greater than $V_c$, the coercive potential. Assuming binary input of $+/-V_s$, the potential with the smallest magnitude is:

$$\bar{V} = V_s/N \tag{8}$$

This occurs when (N+1)/2 of the inputs are $+V_s$ and (N−1)/2 are $-V_s$. Then, $$V_s > N V_c \tag{9}$$

Figure 1B:
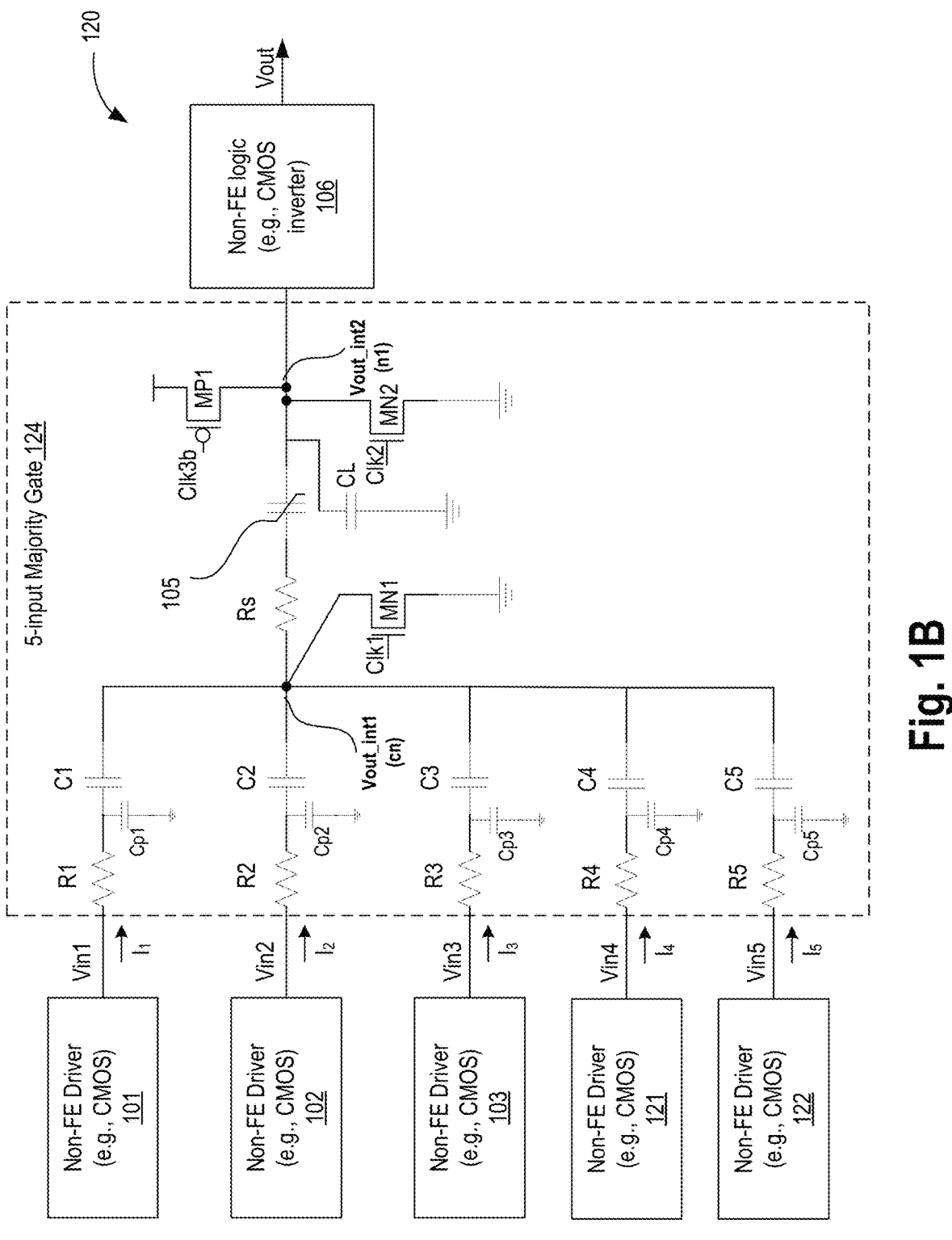
FIG. 1B illustrates a logic gate with a 5-input majority gate, in accordance with some embodiments.
Figure 1C:
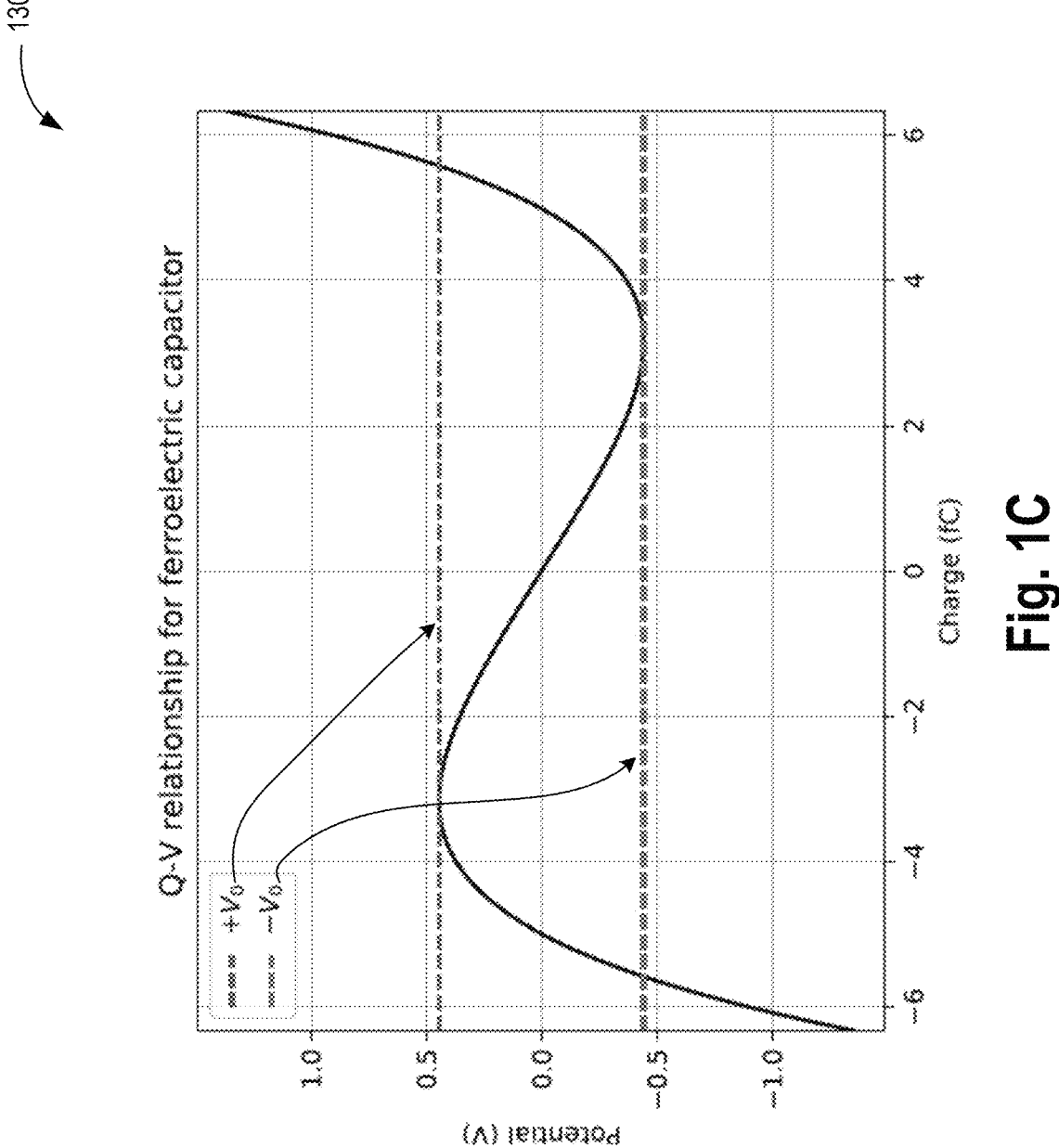
FIG. 1C illustrates a plot showing characteristics of a ferroelectric capacitor.
Figure 1D:
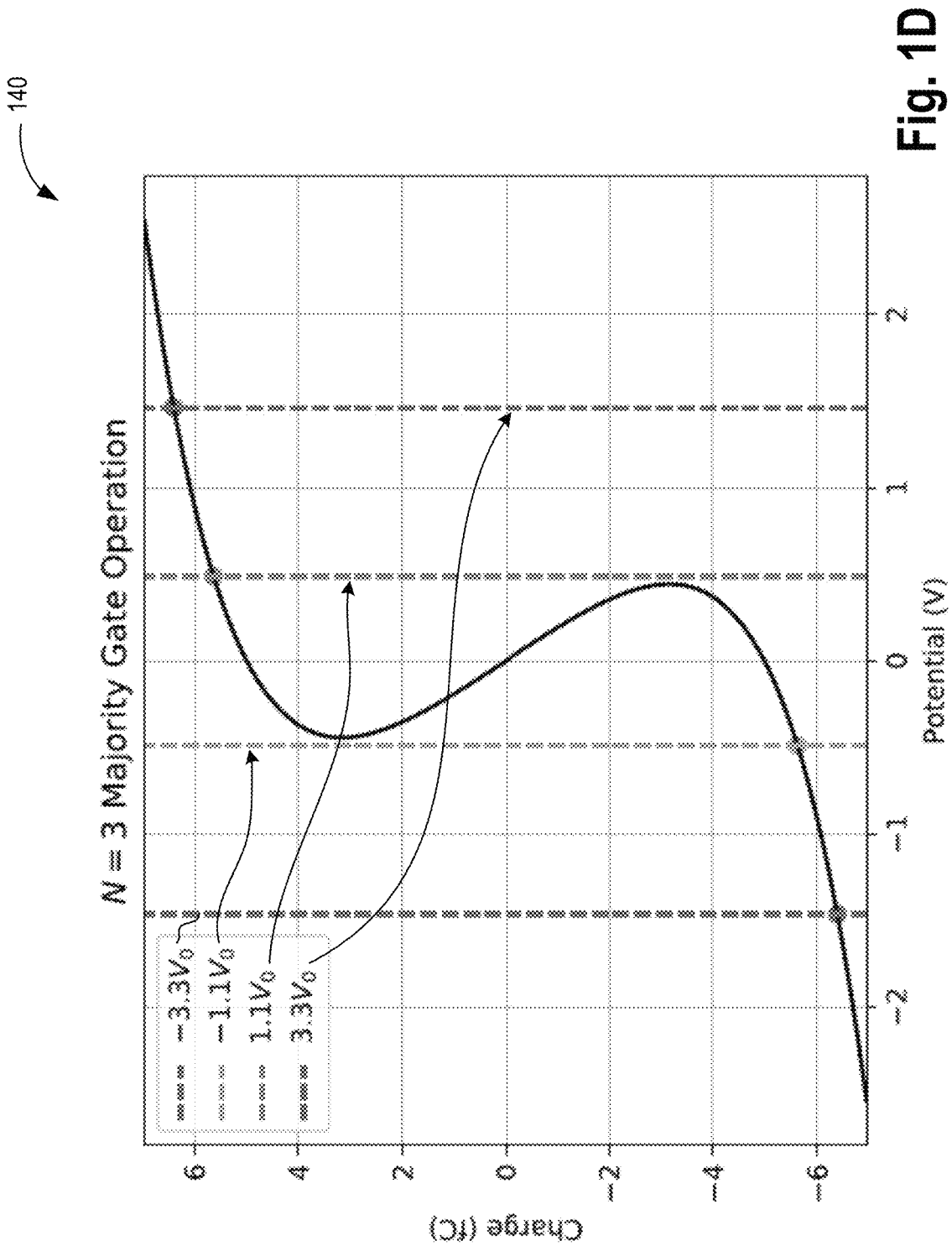
FIG. 1D illustrates a plot showing the output of a 3-input majority gate, in accordance with some embodiments.

The output of the majority gate at node n1 is expressed by FIG. 1D. FIG. 1D illustrates plot 140 showing the output of a 3-input majority gate, in accordance with some embodiments.

As an example, for N=3, the possible inputs are:

$$\bar{V} \in \left\{ -\frac{3}{3}V_s, -\frac{1}{3}V_s, +\frac{1}{3}V_s, +\frac{3}{3}V_s \right\} \tag{10}$$

Referring back to FIG. 1A, since capacitor 105 is a non-linear polar capacitor, both terminals of the capacitor are pre-discharged to ground or to a known predetermined voltage via n-type transistors pull-down transistors MN1 and MN2, and p-type pull-up transistors. The predetermined voltage can be programmable. The pre-determined voltage can be positive or negative. In some embodiments, n-type transistor MN1 is coupled to node Vout_int1 (internal Vout node) and is controllable by clock or reset signal Clk1. In some embodiments, n-type transistor MN2 is coupled to node Vout_int2 (internal Vout node) and is controllable by clock or reset signal Clk2. In some embodiments, p-type transistor MP1 is coupled to node Vout_int2, and is controllable by Clk3b.

In some embodiments, the n-type transistors MN1 and MN2 are replaced with p-type transistors to pre-charge both terminals (Vout_int1 and Vout_int2) of capacitor 105 to a supply voltage or another predetermined voltage, while the p-type transistor MP1 is replaced with an n-type transistor coupled to ground or a negative supply rail. The predetermined voltage can be programmable. The pre-determined voltage can be positive or negative.

Figure 1E:
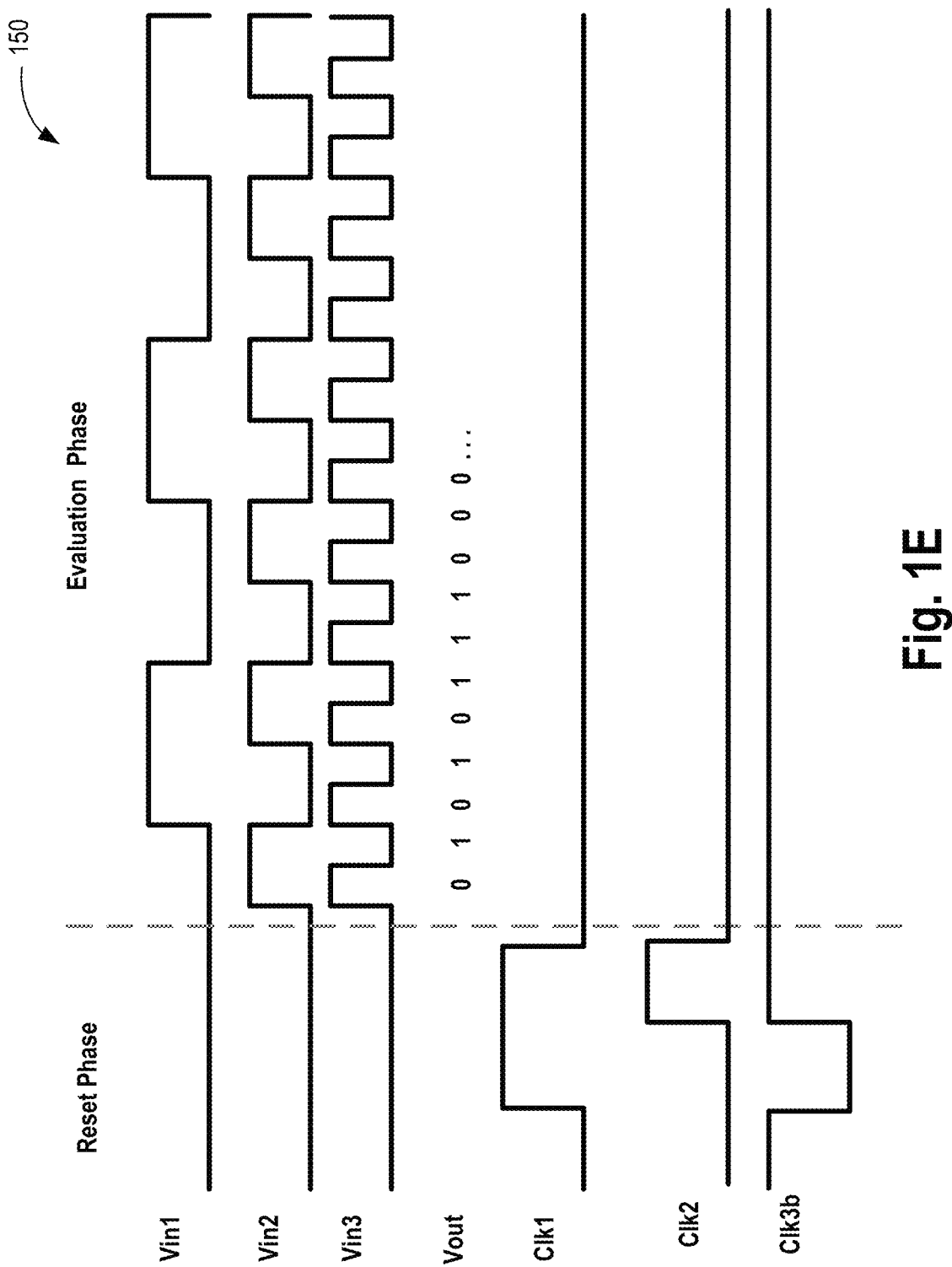
FIG. 1E illustrates a timing diagram for resetting the ferroelectric capacitor for the majority gates of FIGS. 1A-B, in accordance with some embodiments.

In some embodiments, the pre-charge or pre-discharge of the terminals of capacitor 105 (or nodes cn and n1) is done periodically by clock signals Clk1, Clk2, and Clk3b. The controls can be a non-clock signal that is generated by a control logic (not shown). For example, the control can be issued every predetermined or programmable time. In some embodiments, clock signals Clk1, Clk2, and Clk3b are issued in a reset phase, which is followed by an evaluation phase where inputs Vin1, Vin2, and Vin3 are received and majority function is performed on them. FIG. 1E illustrates timing diagram 190 for resetting the ferroelectric capacitor for majority gates of FIGS. 1A-B, in accordance with some embodiments.

Clk1 has a pulse larger than the pulse widths of Clk2 and Clk3b. Clk3b is an inverse of Clk3 (not shown). In some embodiments, Clk1 is first asserted which begins to discharge node Vout_int1. While node Vout_int1 is being discharged, Clk2 is asserted. Clk2 may have a pulse width which is substantially half of the pulse width of Clk1. When Clk2 is asserted, node Vout_int2 is discharged. This sequence assures that both terminals of the non-linear polar material of capacitor 105 are discharged sequentially. In various embodiments, before discharging node Vout_int2, Clk3b is de-asserted which turns on transistor MP1, causing Vout_int2 to be charged to a predetermined value (e.g., supply level). The pulse width of Clk3b is smaller than the pulse width of clk1 to ensure the Clk3b pulsing happens within the Clk1 pulse window. This is useful to ensure non-linear polar capacitor 105 is initialized to a known programmed state along with the other capacitors (e.g., C1, C2, C3) which are initialized to 0 V across them. The pulsing on Vout_int2 creates the correct field across the non-linear polar capacitor 105 in conjunction with Vout_int1 to put it in the correct state, such that during operating mode, if Vout_int1 goes higher than Vc value (coercive voltage value), it triggers the switching for non-linear polar capacitor 105, thereby resulting into a voltage build up on Vout_int2.

In some embodiments, load capacitor CL is added to node Vout_int2. In some embodiments, load capacitor CL is a regular capacitor (e.g., a non-ferroelectric capacitor). The capacitance value of CL on Vout_int2 is useful to ensure that the FE switching charge (of FE capacitor 105) provides the right voltage level. For a given FE size (area A), with polarization switching density (dP) and desired voltage swing of Vdd (supply voltage), the capacitance of CL should be approximately CL=dP*A/Vdd. There is slight deviation from the above CL value as there is charge sharing on Vout_int2 due to dielectric component of FE capacitor 105. Charge sharing responds relative to voltage on Vout_int1, and capacitor divider ratio between the dielectric component of the FE capacitor 105, and load capacitor (CL). Note, the capacitance of CL can be an aggregate of all the capacitances (e.g., parasitic routing capacitance on the node, gate capacitance of the output stage 106, and drain or source capacitance of the reset devices (e.g., MN2, MP1)) on the Vout_int2 node. In some embodiments, for a given size of non-linear polar capacitor 105, CL requirement can be met by just the load capacitance of non-FE logic 106, and parasitic component itself, and may not need to have it as a separate linear capacitor.

Referring back to FIG. 1A, in some embodiments, the non-linear polar material of capacitor 105 includes one of: a ferroelectric (FE) material, a paraelectric material, a relaxor ferroelectric, or a non-linear dielectric. In various embodiments, paraelectric material is same as FE material but with chemical doping of the active ferroelectric ion by an ion with no polar distortion. In some cases, the non-polar ions are non-s orbital ions formed with p, d, and f external orbitals. In some embodiments, non-linear dielectric materials are same as paraelectric materials, relaxors, and dipolar glasses.

In some embodiments, f-orbital materials (e.g., lanthanides) are doped to the ferroelectric material to make paraelectric material. Examples of room temperature paraelectric material include: SrTiO3, Ba(x)Sr(y)TiO3 (where x is −0.5, and y is 0.95), HfZrO2, Hf—Si—O, La-substituted PbTiO3, and PMN-PT based relaxor ferroelectrics.

In various embodiments, the FE material can be any suitable low voltage FE material that allows the FE material to switch its state by a low voltage (e.g., 100 mV). In some embodiments, the FE material comprises a perovskite of the type ABO3, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or lanthanides). Perovskites can be suitably doped to achieve a spontaneous distortion in a range of 0.3% to 2%. For example, for chemically substituted lead titanate such as Zr in Ti site; La or Nb in Ti site, the concentration of these substitutes is such that it achieves the spontaneous distortion in the range of 0.3% to 2%. For chemically substituted BiFeO3, BiCrO3, BiCoO3 class of materials, La or rare earth substitution into the Bi site can tune the spontaneous distortion.

Threshold in the FE material has a highly non-linear transfer function in the polarization versus voltage response. The threshold is related to: a) non-linearity of switching transfer function; and b) to the squareness of the FE switching. The non-linearity of switching transfer function is the width of the derivative of the polarization versus voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished by the use of lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, LaNiO3, and ReO3.

In some embodiments, the FE material comprises a stack of layers including low voltage FE material between conductive oxides. In various embodiments, when FE material is a perovskite, the conductive oxides are of the type $AA'BB'O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, or Zn. A' may have the same valency of site A, with a different ferroelectric polarizability.

In some embodiments, the FE material comprises hexagonal ferroelectrics of the type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of YMnO3 or LuFeO3. In various embodiments, when the FE material comprises hexagonal ferroelectrics, the conductive oxides adjacent to the FE material are of A2O3 (e.g., In2O3, Fe2O3) and AB2O3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 and 100. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: hafnium (Hf), zirconium (Zr), aluminum (Al), silicon (Si), their oxides, or their alloyed oxides. In some embodiments, FE material includes one of: Al(1-x)Sc(x)N, Ga(1-x)S(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes bismuth ferrite (BFO), lead zirconate titanate (PZT), BFO with a first doping material, or PZT with a second doping material, wherein the doping material is one of Nb or La; and relaxor ferroelectrics such as PMN-PT.

In some embodiments, the FE material includes bismuth ferrite (BFO) or BFO with a first doping material wherein the first doping material is one of lanthanum, or any element from the lanthanide series of the periodic table. In some embodiments, the FE material 105 includes lead zirconium titanate (PZT) or PZT with a second doping material, wherein the second doping material is one of La or Nb. In some embodiments, the FE material includes a relaxor ferroelectric, which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In some embodiments, the FE material includes hafnium oxides of the form, Hf1-x Ex Oy, where E can be Al, Ca, Ce, Dy, Er, Gd, Ge, La, Sc, Si, Sr, Sn, or Y. In some embodiments, FE material 105 includes niobate type compounds LiNbO3, LiTaO3, lithium iron tantalum oxy fluoride, barium strontium niobate, sodium barium niobate, or potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are 'n' octahedral layers in thickness can be used.

In some embodiments, the FE material comprises organic material. For example, polyvinylidene fluoride or polyvinylidene difluoride (PVDF).

The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include indium tin oxide (ITO) such as Sn-doped In2O3.

The charge developed on node n1 produces a voltage and current that is the output of the majority gate 104. Any suitable driver 106 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, etc. In some embodiments, output "out" is reset by driver 106 via Clk1 signal. For example, NAND gate with one input coupled to Vout_int2 and the other input coupled to Clk1 can be used to reset "out" during a reset phase.

While FIG. 1A illustrates a 3-input majority gate, the same concept can be extended to more than 3 inputs to make an N-input majority gate, where N is greater than 2.

FIG. 1B illustrates logic gate 120 with 5-input majority gate 124, in accordance with some embodiments. 5-input majority gate 124 is similar to 3-input majority gate 104 but for additional inputs Vin4 and Vin5. These inputs can come from the same drivers (e.g., any one of drivers 101, 102, or 103) or from different drivers such as driver 121 and 122. Input Vin4 and Vin5 can be analog, digital, or a combination of them. For example, Vin4 is a digital signal while Vin5 is an analog signal. The additional inputs Vin4 and Vin5 are coupled to additional non-ferroelectric capacitors C4 and C5, respectively. The composition and size of the capacitors C4 and C5 are similar to that of C1, C2, and C3. Here, resistors R4 and R5 are parasitic resistors.

The majority function is performed at the common node cn, and the resulting voltage is projected on to capacitor 105. For example, the majority function of the currents ($I_1$, $I_2$, $I_3$, $I_4$, and $I_5$) on node cn results in a resultant current that charges capacitor 105. Table 2 illustrates the majority function f(Majority Vin1, Vin2, Vin3, Vin4, Vin5) of 5-input majority gate 124

TABLE 2

| Vin1 | Vin2 | Vin3 | Vin4 | Vin5 | cn (f(Majority Vin1, Vin2, Vin3, Vin4, Vin5)) |
|---|---|---|---|---|---|
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 0 |
| 0 | 0 | 1 | 1 | 0 | 0 |
| 0 | 0 | 1 | 1 | 1 | 1 |
| 0 | 1 | 0 | 0 | 0 | 0 |
| 0 | 1 | 0 | 0 | 1 | 0 |
| 0 | 1 | 0 | 1 | 0 | 0 |
| 0 | 1 | 0 | 1 | 1 | 0 |
| 0 | 1 | 1 | 0 | 0 | 0 |
| 0 | 1 | 1 | 0 | 1 | 1 |
| 0 | 1 | 1 | 1 | 0 | 1 |
| 0 | 1 | 1 | 1 | 1 | 1 |
| 1 | 0 | 0 | 0 | 0 | 0 |
| 1 | 0 | 0 | 0 | 1 | 0 |
| 1 | 0 | 0 | 1 | 0 | 0 |
| 1 | 0 | 0 | 1 | 1 | 1 |
| 1 | 0 | 1 | 0 | 0 | 0 |
| 1 | 0 | 1 | 0 | 1 | 1 |
| 1 | 0 | 1 | 1 | 0 | 1 |
| 1 | 0 | 1 | 1 | 1 | 1 |
| 1 | 1 | 0 | 0 | 0 | 0 |
| 1 | 1 | 0 | 0 | 1 | 1 |
| 1 | 1 | 0 | 1 | 0 | 1 |
| 1 | 1 | 0 | 1 | 1 | 1 |
| 1 | 1 | 1 | 0 | 0 | 1 |
| 1 | 1 | 1 | 0 | 1 | 1 |
| 1 | 1 | 1 | 1 | 0 | 1 |
| 1 | 1 | 1 | 1 | 0 | 1 |

Figure 1F:
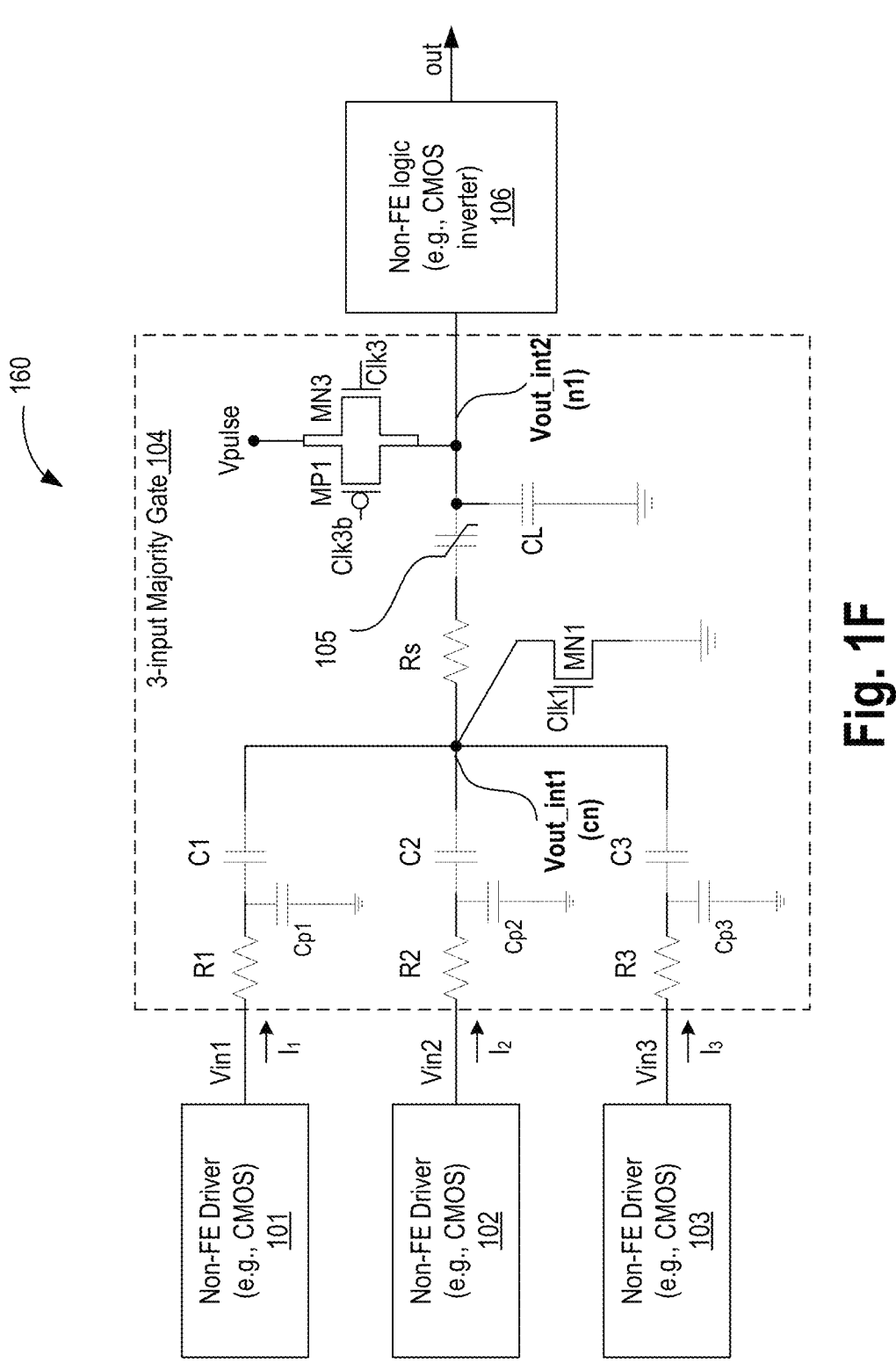
FIG. 1F illustrates a logic gate with a 3-input majority gate with pass-gate based resetting mechanism, in accordance with some embodiments.
Figure 1G:
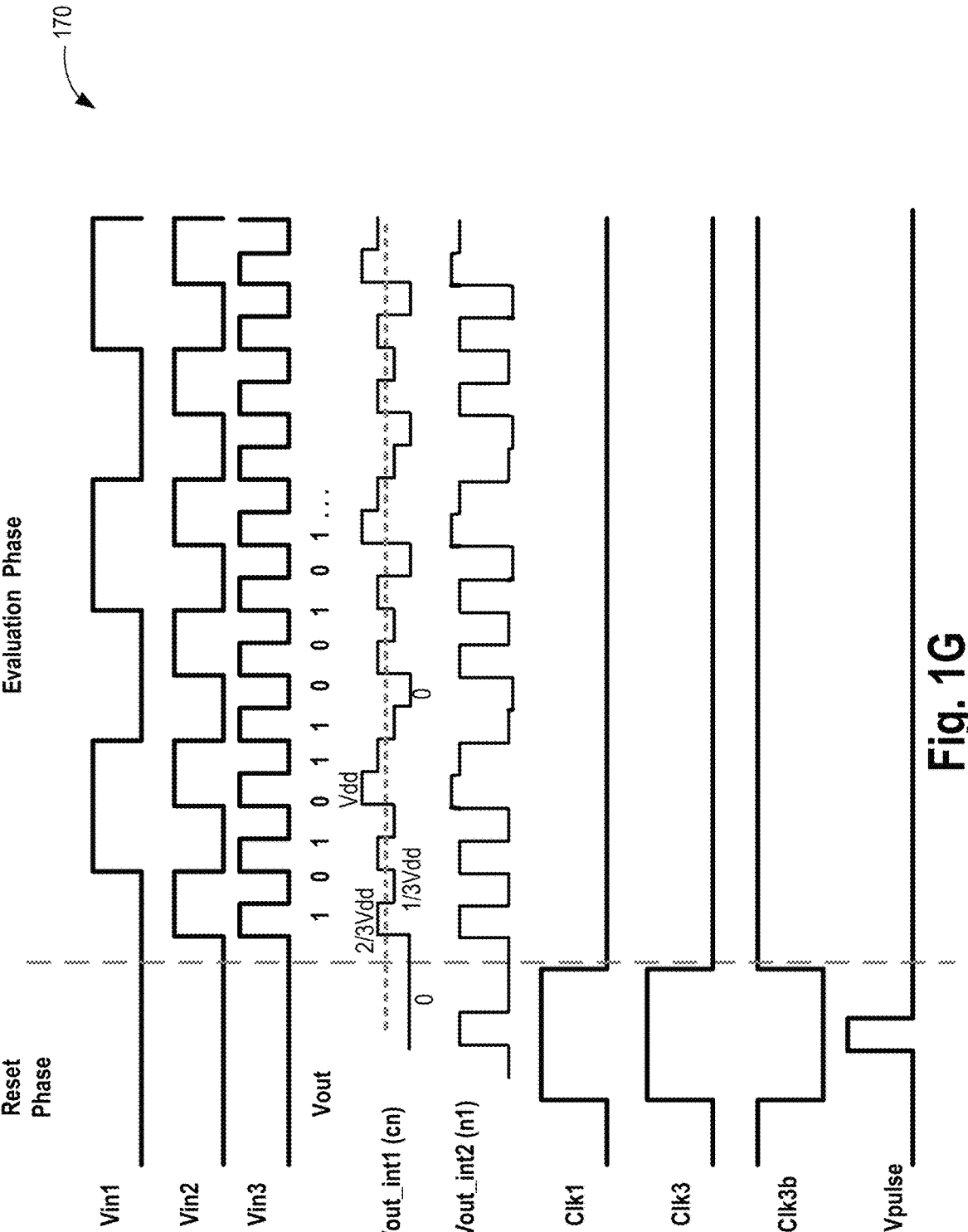
FIG. 1G illustrates a timing diagram for resetting the ferroelectric capacitor for majority gate of FIG. 1F, in accordance with some embodiments.

FIG. 1F illustrates logic gate 160 with a 3-input majority gate with pass-gate based resetting mechanism, in accordance with some embodiments. Logic gate 160 is similar to logic gate 100 but for the reset mechanism to reset the terminals of non-linear polar capacitor 105. Here, pull-down transistor MN2 is removed and a pass-gate comprising p-type transistor MP1 and n-type transistor MN3 are coupled to Vout_int2 node. In some embodiments, transistor MN3 is controlled by Clk3 while transistor MP1 is controlled by Clk3b, where Clk3b is an inverse of Clk3. In some embodiments, Vpulse passes through the pass-gate to Vout_int2 when Clk1 and Clk3 are asserted and before Clk1 and Clk3 are de-asserted. Vpulse is generated during a reset phase, and is de-asserted during the evaluation phase as illustrated by FIG. 1G. FIG. 1G illustrates timing diagram 170 for resetting the ferroelectric capacitor for majority gate of FIG. 1F, in accordance with some embodiments.

During reset phase, node Vout_Int1 is first reset or discharged to ground by asserting a Clk1 pulse. In the same phase, transistors MP3 and MP1 are turned on, and Vpulse is applied to node Vout_Int2.

Here Vpulse cases out the relative timing control from the perspective of signal generation. Vpulse also minimizes charge injection on Vout_int2 node due to differential nature of switching that happens on the pass gate. Note, the pass-gate reduces the charge injection due to charge sharing as transistors MP1 and MN3 of the pass-gate approximately cancel the charge injection at Vout_int2 node due to switching event on the pass-gate. The gray dotted horizontal line shown for Vout_int1 (cn) node indicates where the Vc of FE capacitor 105 will create switching action. For majority gate design, in some embodiments, this gray dotted horizontal line is positioned close to Vdd/2 (e.g., Vc=Vdd/2), where Vdd is logic high value.

In some cases, when all inputs are zeros (e.g., Vin1=Vin2=Vin3=0 or Vss), which is referred to 3L, then the voltage on Vout_int1 and/or Vout_int1 may fall below Vss (or ground) level. The same may occur when all inputs are ones (e.g., Vin1=Vin2=Vin3=1 or Vss), which is referred to as 3H, where the voltage on Vout_int1 and/or Vout_int1 may rise above Vdd (or supply) level. This, however, may depend on the exact amount of charge injection on the node cn at time 0 after assertion of the input signals. So, all three inputs being logic low (3L) translates into a slightly different levels compared to two inputs being logic low (2L). Here, 3H refers to all three inputs being high, 2H refers to two inputs being high and one input being low, and 1H refers to one input being high and two inputs being low. The same explanation is used for nomenclature 3L, 2L, and 1L. In the 1H case, the voltage on node cn and n1 may be slightly higher than ground. The same is the case with 3H which translates into slightly higher voltage level on nodes cn and/or n1 than in 2H and 1L cases.

Figure 1H:
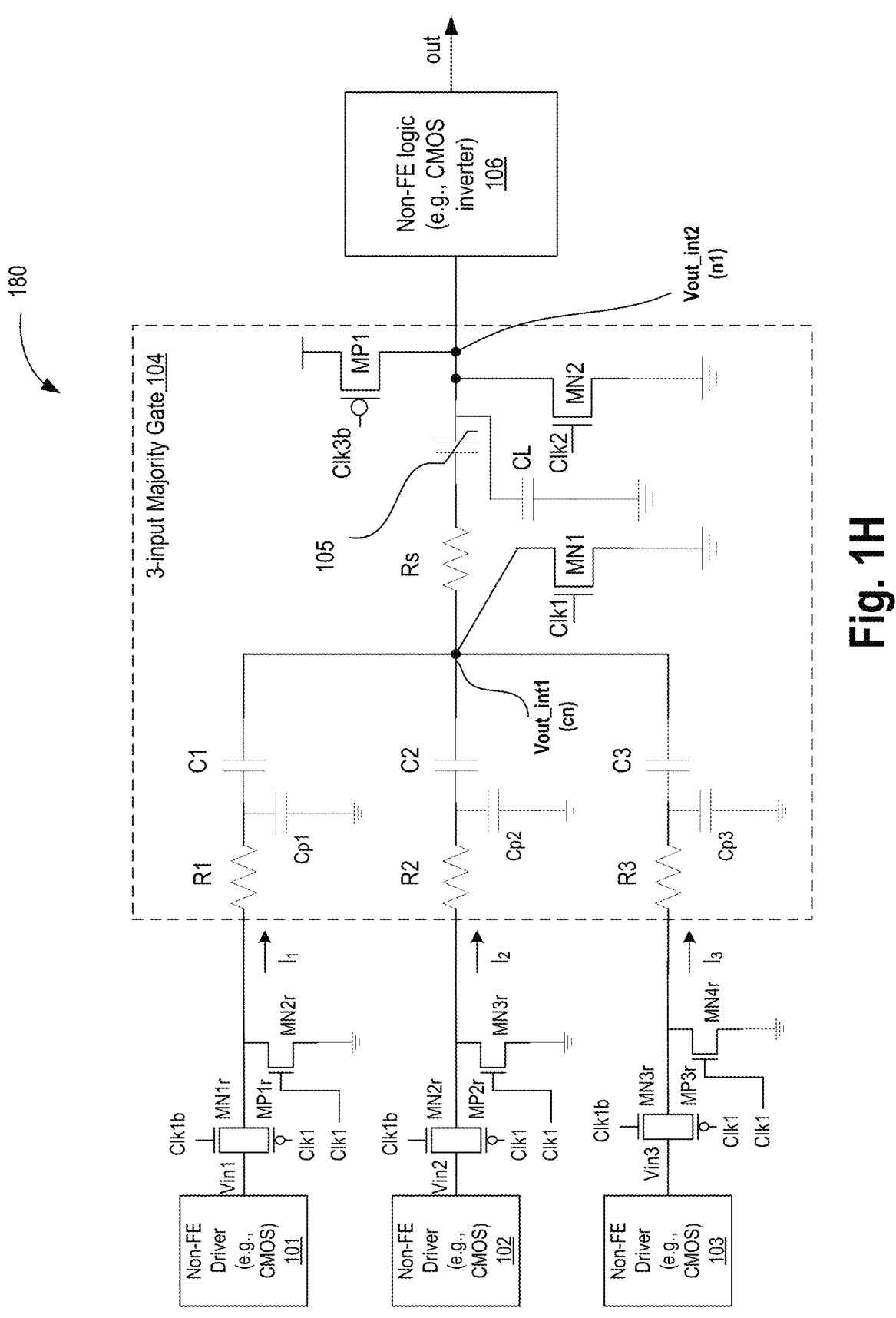
FIG. 1H illustrates a logic gate with a 3-input majority gate with input resetting mechanism, in accordance with some embodiments.

FIG. 1H illustrates logic gate 180 with a 3-input majority gate with input resetting mechanism, in accordance with some embodiments. Compared to the reset mechanisms described with reference to FIGS. 1A-B, and E-G, here the inputs (e.g., Vin1, Vin2, Vin3) are blocked from propagating during reset phase. Logic gate 180 is similar to logic gate 100 but for the determinism of input voltages during reset of capacitor 105.

In some embodiments, for reset mechanisms of FIGS. 1A-B, and E-G logic that generates input signals (e.g., Vin1 through Vin5) is aware of the reset timing, and as such ensures sending the right input signals (0 V in this illustration) for processing when capacitor 105 is being reset. Generating the input signals at predetermined voltage levels (e.g., 0 V) ensures predetermined voltage (e.g., 0V) across the linear capacitors (e.g., C1, C2, C3). When such predetermined input signals are generated, pass-gates on the input signal nodes can be removed to save area and cost.

In some other embodiments for multiple stages of these majority gates between a logic cluster, the reset sequencing can be controlled from input vectors to correctly create the correct voltage levels during the reset phase at each one of the stages. In some embodiments, a logic gate is provided at the input (e.g., Vin) such that correct voltage level at all stages are driving the right logic. For example, an NAND gate, with one of the inputs being a reset signal, and the other the logic level (e.g., Vin1), ensure during reset phase that the correct voltage level is applied at input of each one of the stages. In another example, the output of each logic is conditioned during reset to cause the subsequent logic (e.g., majority gate logic) to receive the correct input voltage level during reset. In one such example, non-FE logic 106 comprises an NAND gate with one of its input being a reset signal, and the other the logic level (e.g., coupled to Vout_int2), ensures that during reset phase the correct voltage level is propagated to the input of the next or subsequent majority gate stage.

In some embodiments, a first pass-gate is coupled to first capacitor C1 and driver that generates first input Vin1. The first pass-gate comprises p-type transistor MP1r controllable by Clk1 and n-type transistor MN1r controllable by Clk1b. The first pass-gate blocks the propagation of Vin1 while pull-down transistor MN2r can set the input to capacitor C1 to ground via Clk1. In some embodiments, a second pass-gate is coupled to second capacitor C2 and driver that generates the second input Vin2. The second pass-gate comprises p-type transistor MP2r controllable by Clk1 and n-type transistor MN2r controllable by Clk1b. The second pass-gate blocks the propagation of Vin2 while pull-down transistor MN3r can set the input to capacitor C2 to ground via Clk1. In some embodiments, a third pass-gate is coupled to third capacitor C3 and driver that generates the third input Vin3. The third pass-gate comprises p-type transistor MP3r controllable by Clk1 and n-type transistor MN3r controllable by Clk1b. The third pass-gate blocks the propagation of Vin3 while pull-down transistor MN4r can set the input to capacitor C3 to ground via Clk1. The same technique is applied to other inputs.

Figure 1I:
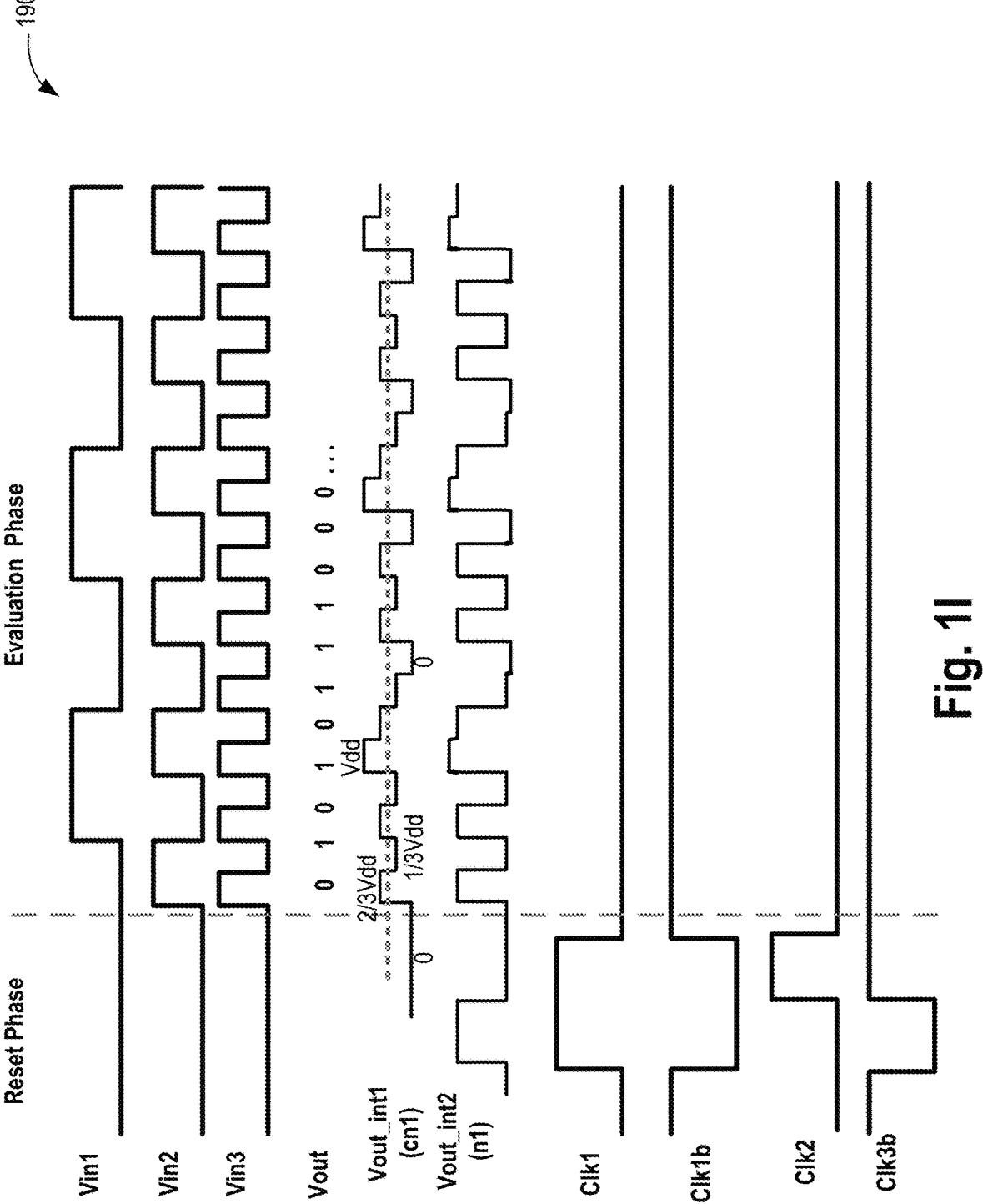
FIG. 1I illustrates a timing diagram for resetting the ferroelectric capacitor for majority gate of FIG. 1H, in accordance with some embodiments.

FIG. 1I illustrates timing diagram 190 for resetting the ferroelectric capacitor for majority gate of FIG. 1H, in accordance with some embodiments. During reset phase, Clk1 is asserted (and Clkb is de-asserted) to block the input voltages and to set the input to capacitors C1, C2, and C3 to ground. Assertion of Clk1 also discharges Vout_int1. As such, voltages on both terminals of input capacitors C1, C2, and C3 are discharged. Clk3b is initially (during reset phase) de-asserted to turn on MP1 to pre-charge Vout_int2. Thereafter, Clk2 is asserted to discharge Vout_int2.

The reset mechanism can be described in terms of two sequences of pulses. The first sequence of pulses is to create the right field across the FE capacitor 105 to initialize it in correct state for operation, while the second sequence of pulses ensures that all the nodes are initialized to 0 state, with all the linear caps (e.g., C1, C2, C3) having 0 V across them. The exact sequence also factors in glitchless transition to minimize charge injection on high impedance nodes, and ensures that the ferroelectric device 105 does not see a transient due to reset pulsing that will compromise the initial programmed state for FE device 105.

The reset mechanism of various embodiments can also be described in terms of four phases. In the first phase (phase 1), linear capacitors (C1, C2, and C3) are initialized to zero state using Clk1 (e.g., by asserting Clk1) and input conditioning (e.g., setting the inputs Vin1, Vin2, and Vin3 to zero). In the second phase (phase 2), FE capacitor 105 continues to be initialized using Clk3b (e.g., de-asserting Clkb3) while keeping Clk1 high (e.g., Clk1 remains asserted). In the third phase (phase 3), Vout_int2 node and the dielectric component of FE capacitor 105 is initialized to zero state by de-asserting Clk2, asserting Clk3b, and while keeping Clk1 high (e.g., Clk1 remains asserted). In the fourth phase (phase 4), the reset switches are deactivated. For example, transistors MN1r, MP1r (and other pass-gate switches at the inputs) are turned on, MN2r (and other pull-down transistors) on the input nodes (e.g., Vin1, Vin2) are turned off, pull-down transistors MN1 and MN2 are disabled or turned off, pull-up transistors MP1 is disabled or turned off, and Vpulse pass-gate having transistors MP1 and MN3 disabled.

While the embodiments here are described with reference to resetting the FE device 105 to ground and/or resetting the two terminals of non-ferroelectric linear capacitors (C1, C2, C3) to ground, the resetting voltage can be different voltage other than ground. For example, when input signals (e.g., Vin1, Vin2, or Vin3) toggle between a positive supply level and a negative supply level, then the two terminals of FE device 105 and/or the two terminals of non-ferroelectric linear capacitors (C1, C2, C3) are reset to the negative supply rail. For example, the definition of logic low and logic high to control the various reset devices changes to positive and negative, respectively. So, if earlier rails were 0 V and Vdd and now they are negative to positive rails, the 0 V maps to negative and Vdd maps to positive.

Figure 1J:
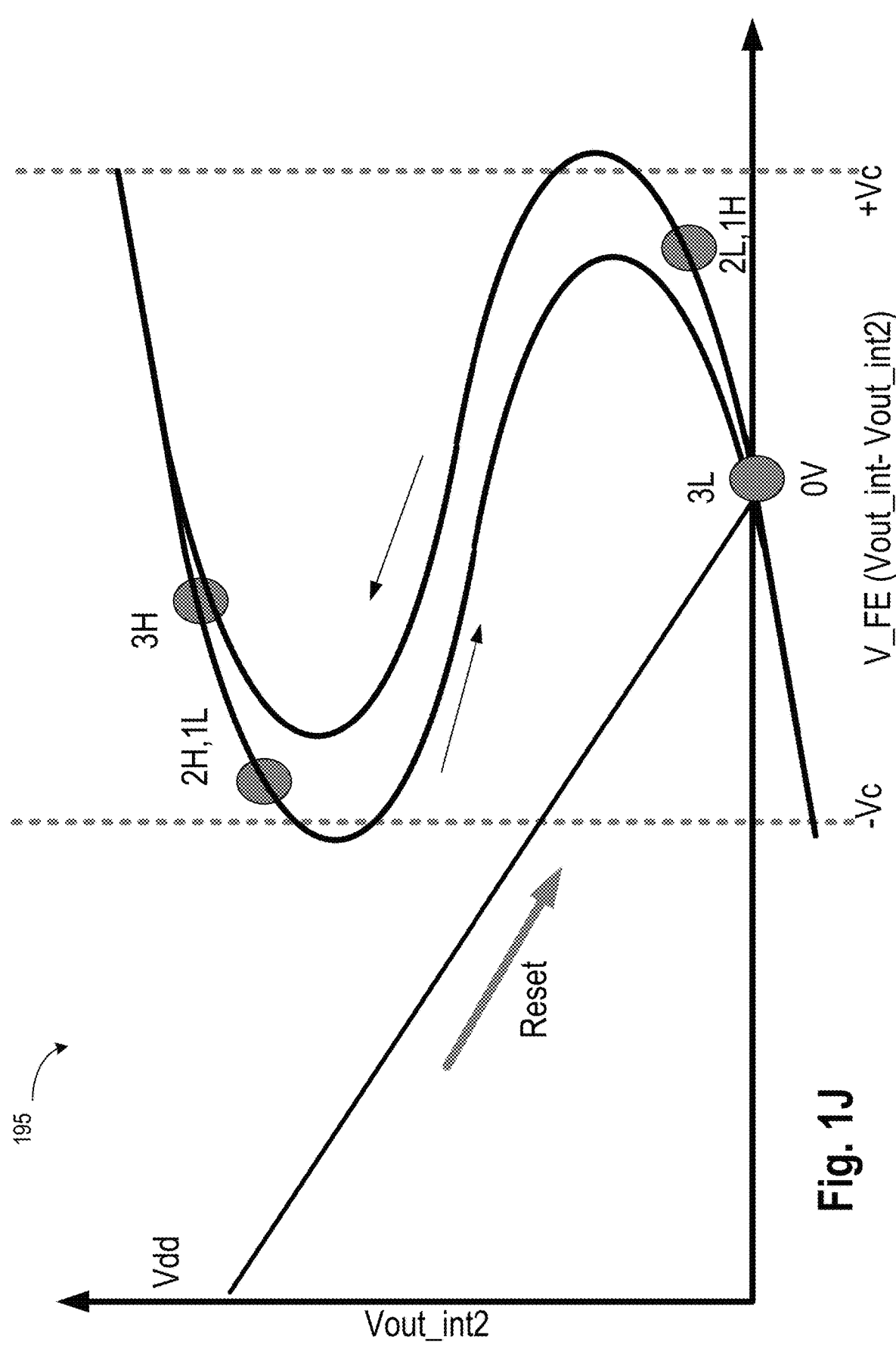
FIG. 1J illustrates plot showing the voltage on node Vout_int2 relating to the behavior of ferroelectric capacitors, in accordance with some embodiments.

FIG. 1J illustrates plot 195 showing the voltage on node Vout_int2 relating to the behavior of FE capacitor 105, in accordance with some embodiments. In this case, FE capacitor 105 stays within the window of Vc voltage drop across FE capacitor 105, but switching helps to generate different voltages on Vout_int2. For example, at time 0 during reset (when Clk1 is asserted and other signals such as Clk1b, Clk2, Clk3b, and Vpulse behave according to FIG. 1G and FIG. 1I), large reset field puts FE capacitor 105 in low state, and then FE capacitor 105 bounces between +Vc, and −Vc.

Figure 2A:
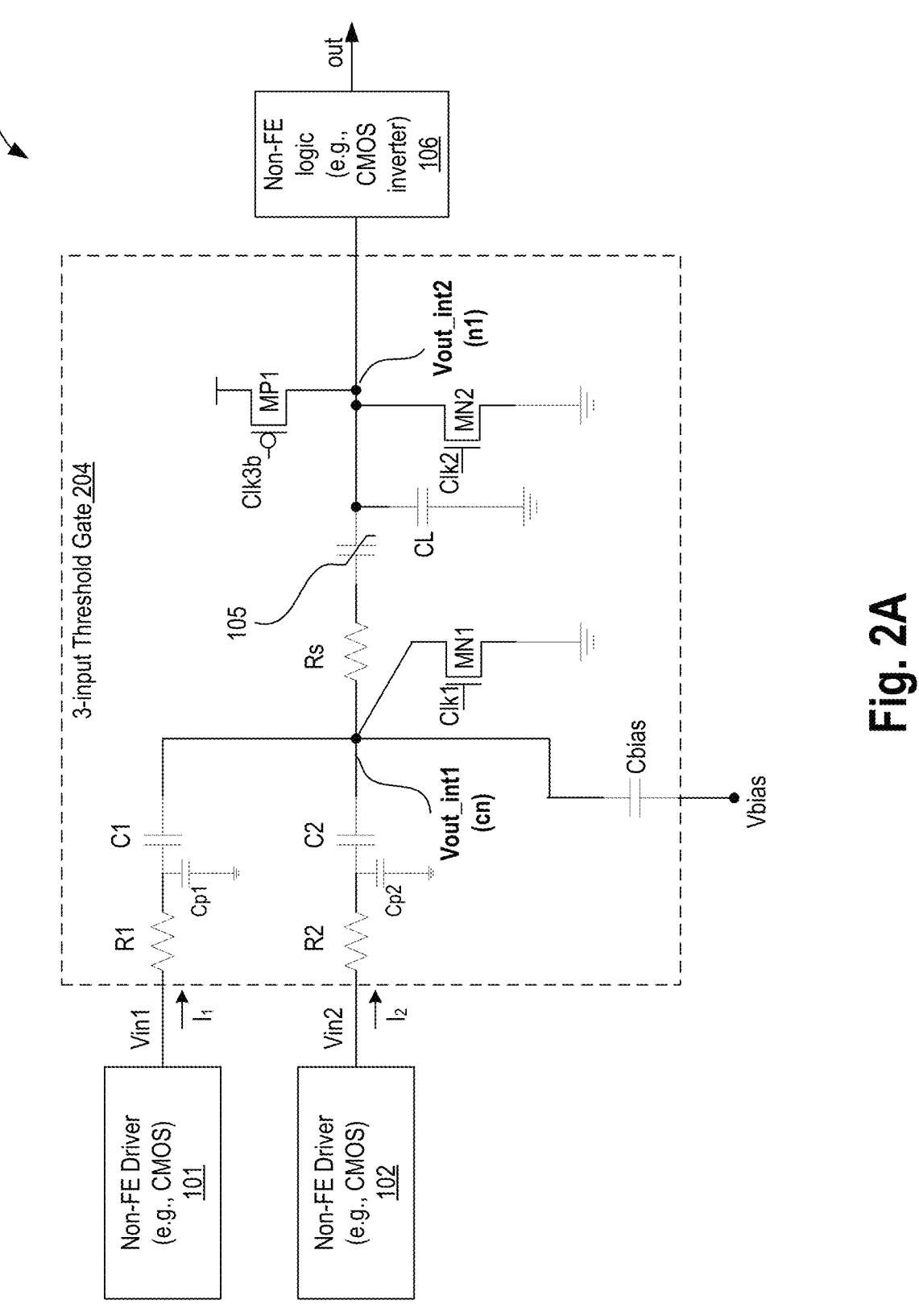
FIG. 2A illustrates a logic gate with a 3-input threshold gate which can operate as an AND or an OR gate, in accordance with some embodiments.

FIG. 2A illustrates logic gate 200 with 3-input threshold gate 204 which can operate as an AND or an OR gate, in accordance with some embodiments. Logic gate 200 is similar to logic gate 100 but for removing the third input Vin and adding an input Vbias. This additional input bias makes the logic gate a threshold gate 204. Threshold gate 204 is referred to as a 3-input threshold gate because of the three inputs Vin1, Vin2, and Vbias. It can also be referred to as 2-input threshold gate if the Vbias input is not counted as a separate input. In various embodiments, threshold gate 204 comprises an additional capacitor Cbias that has one terminal coupled to node cn and another terminal coupled to Vbias. The material for capacitor Cbias can be same as material for capacitors C1, C2, and C3. For example, capacitor Cbias comprises non-ferroelectric material.

Vbias can be positive or negative voltage depending on the desired logic function of threshold gate 204. Any suitable source can generate Vbias. For example, a bandgap reference generator, a voltage divider such as a resistor divider, a digital to analog converter (DAC), etc., can generate Vbias. Vbias can be fixed or programmable (or adjustable). For example, Vbias can be adjusted by hardware (e.g., fuses, register), or software (e.g., operating system). In some embodiments, when Vbias is positive, the majority function on node cn is an OR function. For example, the function at node cn is OR(Vin1, Vin2, 0). In some embodiments, when Vbias is negative, the majority function on node cn is an AND function. For example, the function at node cn is AND(Vin1, Vin2, 1). Table 2 and Table 3 summarizes the function of threshold gate 206. Applying a positive voltage or Vbias can be akin to applying an input signal logic high as well. Likewise, applying a negative voltage on Vbias can be akin to applying an input signal logic low as well.

TABLE 3

| Vin1 | Vin2 | Vbias | cn OR(Vin1, Vin2, Vbias) |
|------|------|-------|--------------------------|
| 0 | 0 | Positive or logic 1 | 0 |
| 0 | 1 | Positive or logic 1 | 1 |
| 1 | 0 | Positive or logic 1 | 1 |
| 1 | 1 | Positive or logic 1 | 1 |

TABLE 4

| Vin1 | Vin2 | Vbias | cn AND(Vin1, Vin2, Vbias) |
|---|---|---|---|
| 0 | 0 | Negative or logic 0 | 0 |
| 0 | 1 | Negative or logic 0 | 0 |
| 1 | 0 | Negative or logic 0 | 0 |
| 1 | 1 | Negative or logic 0 | 1 |

Compared to transitional CMOS AND logic gate and OR logic gate, here the AND function and OR function are performed by a network of capacitors. The output of the majority or threshold function on node cn is then stored in the non-linear polar capacitor 105. This capacitor provides the final state of the logic in a non-volatile form. As such, the logic gate of various embodiments describes a non-volatile multi-input AND or OR gate with one or two transistors for pre-discharging or pre-charging nodes cn and n1. The silicon area of the AND or OR gates of various embodiments is orders of magnitude smaller than traditional AND or OR gates. While FIG. 2A illustrates a 3-input threshold gate, the same concept can be extended to more than 3 inputs to make an N-input threshold gate, where N is greater than 2 and an odd number. The reset mechanism of FIG. 2A is similar to the one described with reference to FIG. 1A.

Figure 2B:
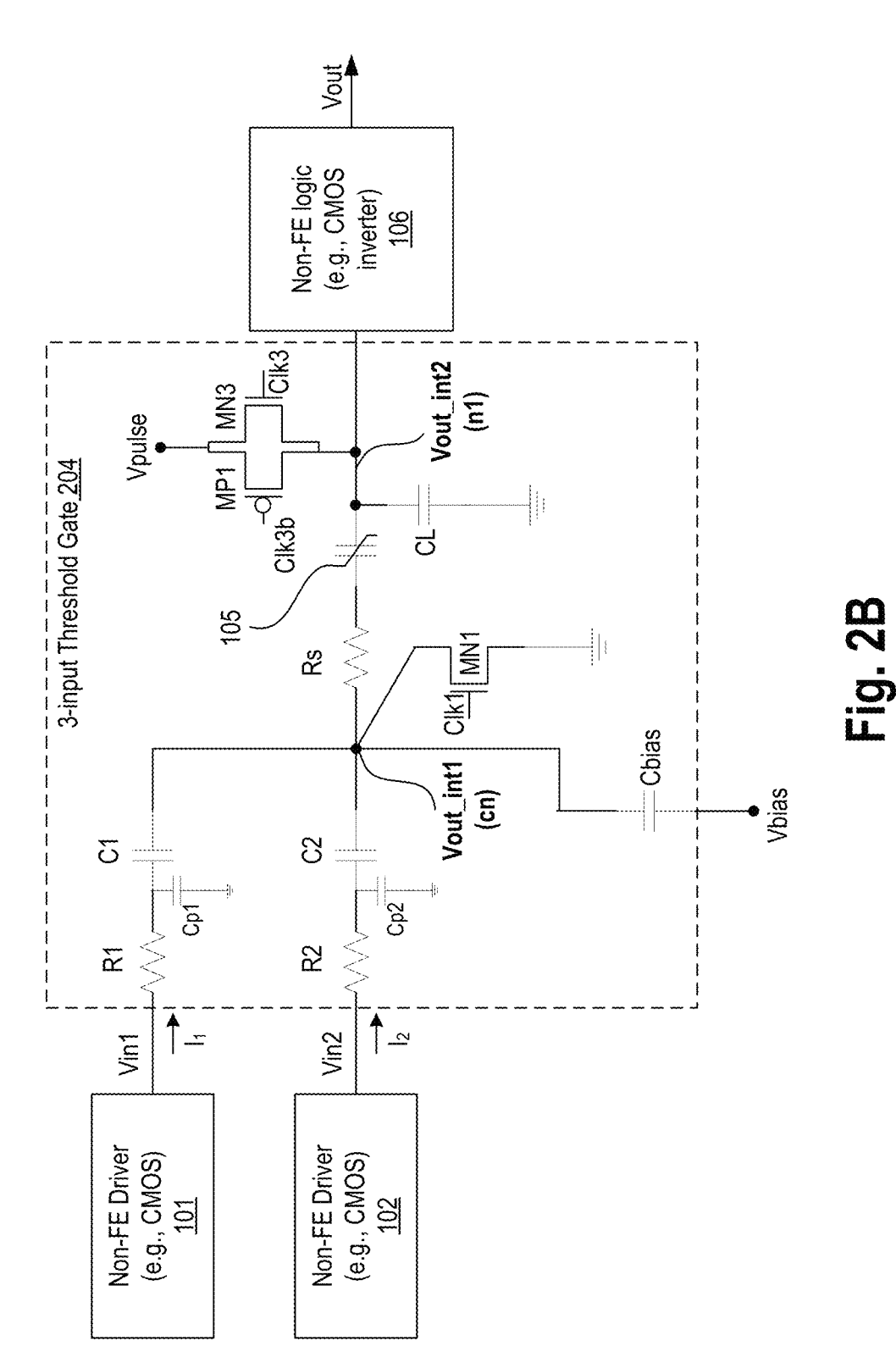
FIG. 2B illustrates a logic gate with a 3-input threshold gate, with pass-gate based reset mechanism, where the 3-input threshold gate can operate as an AND or an OR gate, in accordance with some embodiments.

FIG. 2B illustrates logic gate 220 with a 3-input threshold gate, with pass-gate based reset mechanism, where the 3-input threshold gate can operate as an AND or an OR gate, in accordance with some embodiments. Logic 220 is similar to logic 200 but for the reset mechanism. The reset mechanism of FIG. 2B is similar to the one described with reference to FIG. 1F.

Figure 2C:
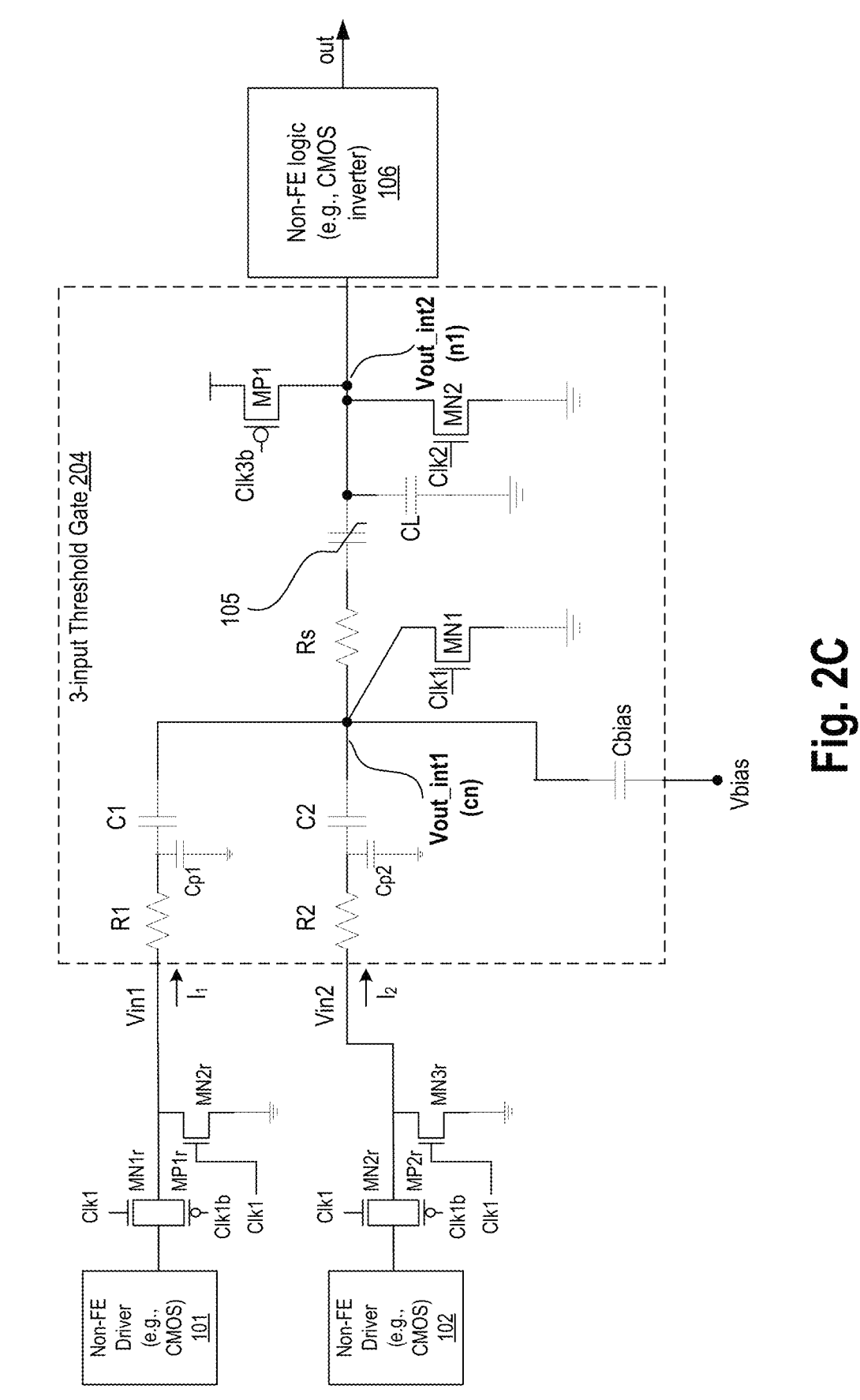
FIG. 2C illustrates a logic gate with a 3-input threshold gate, with input resetting mechanism, where the 3-input threshold gate can operate as an AND or an OR gate, in accordance with some embodiments.

FIG. 2C illustrates logic gate 230 with a 3-input threshold gate, with input resetting mechanism, where the 3-input threshold gate can operate as an AND or an OR gate, in accordance with some embodiments. Logic 230 is similar to logic 200 but for the reset mechanism. The reset mechanism of FIG. 2C is similar to the one described with reference to FIG. 1H.

Figure 3:
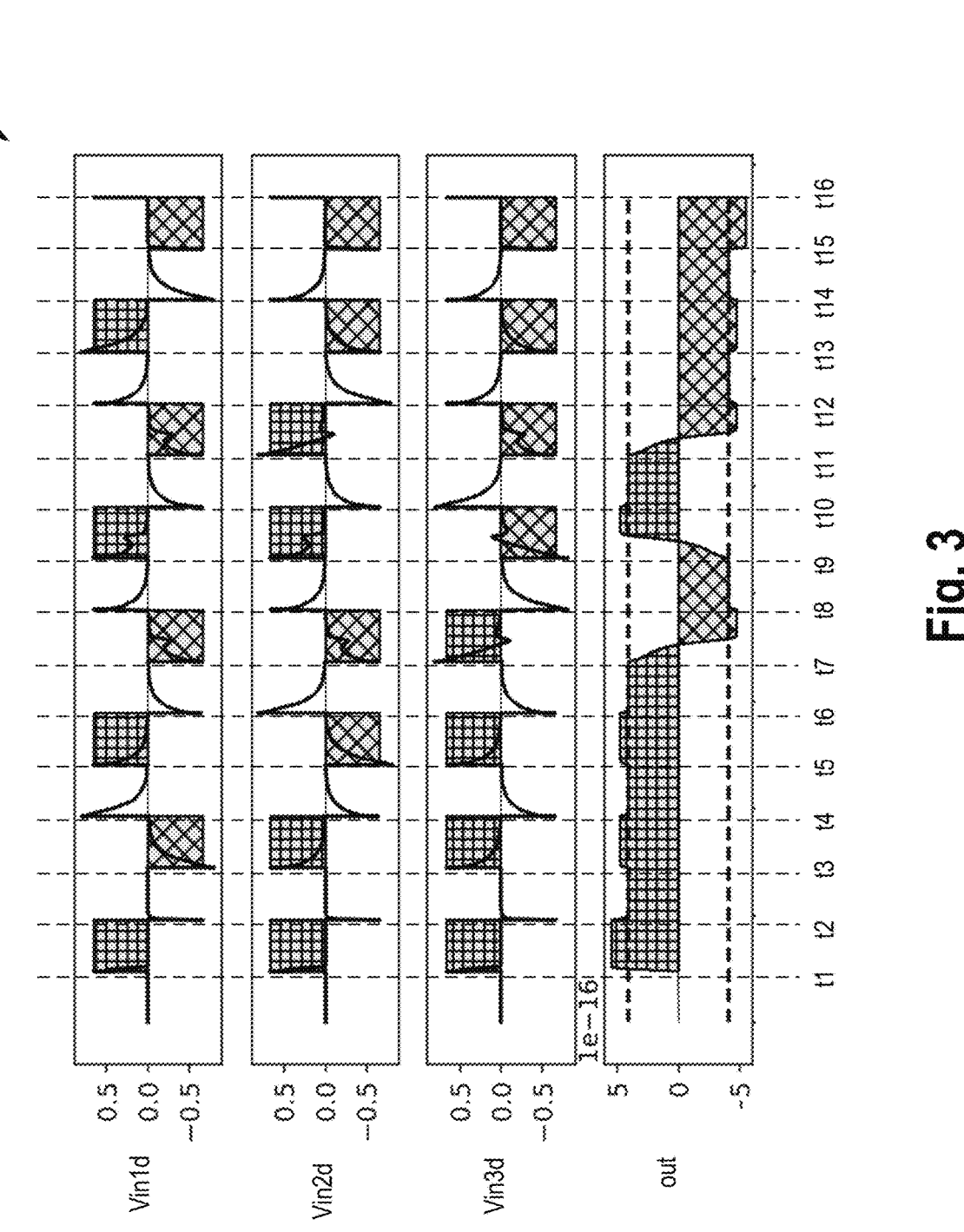
FIG. 3 illustrates waveforms showing operation of 3-input majority gate of FIG. 1A, in accordance with some embodiments.

FIG. 3 illustrates waveforms 300 showing operation of 3-input majority gate of FIG. 1A, in accordance with some embodiments. FIG. 3 illustrates a majority function of inputs Vin1, Vin2, and Vin3.

Figure 4:
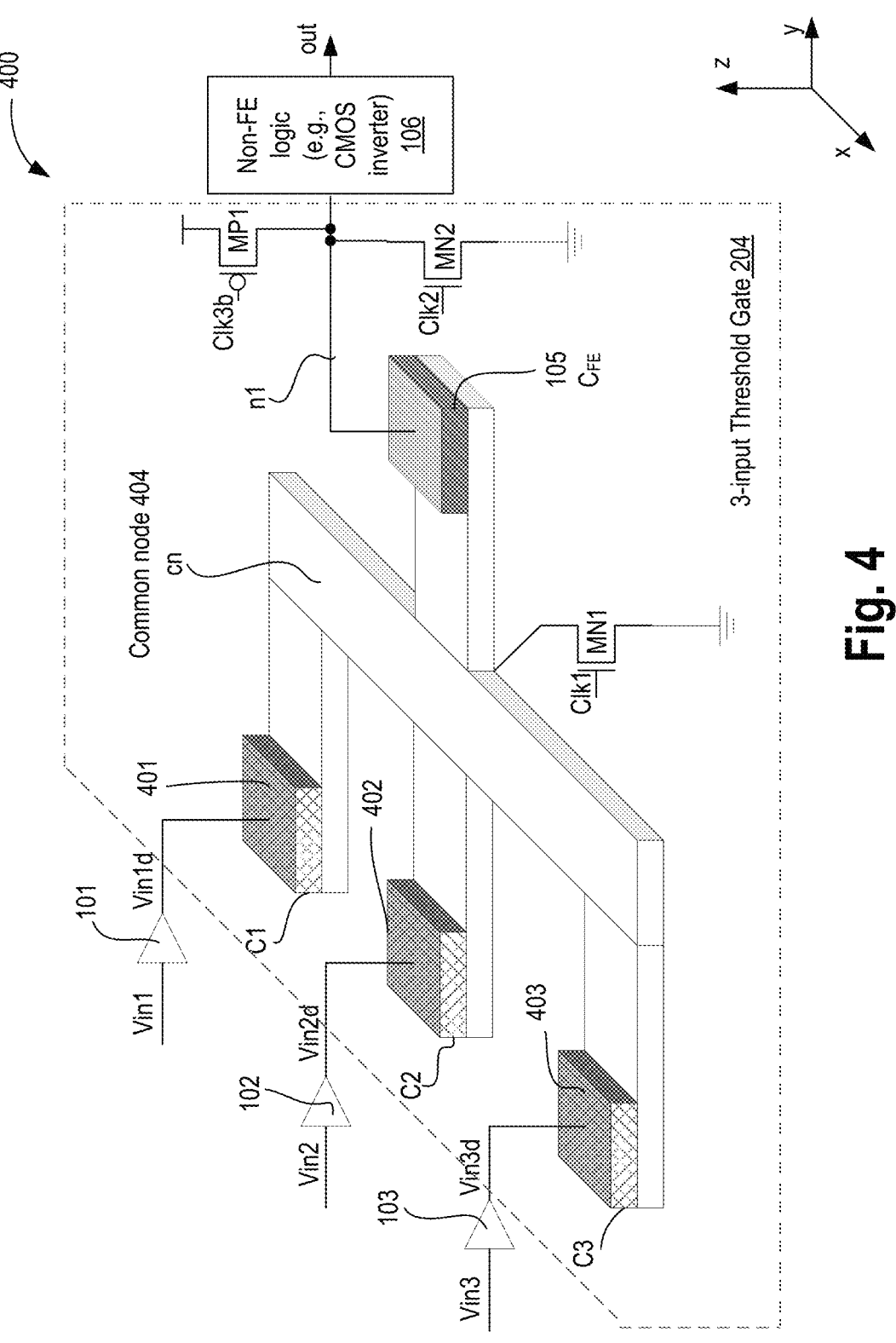
FIG. 4 illustrates combinational logic including the logic gate of FIG. 1A, 1F, and/or 1H with a 3D (three-dimensional) view of the 3-input majority gate that couples to an inverter or buffer, in accordance with some embodiments.

FIG. 4 illustrates combinational logic 400 including the logic gate of FIG. 1A with a 3D (three-dimensional) view of the 3-input majority gate that couples to an inverter or buffer, in accordance with some embodiments. Any of the reset mechanisms described herein (e.g., with reference to FIGS. 1A-J) are applicable to logic 400.

In this example, capacitors C1 (401), C2 (402), and C3 (403) are MIM capacitors that receive inputs Vin1, Vin2, and Vin3, respectively, on their first terminals from buffers or drivers 101, 102, and 103, respectively. However, other types of capacitors can be used. For example, hybrid of metal and transistor can be used to implement the capacitor. The second terminals of capacitors C1 (401), C2 (402), and C3 (403) are coupled to common node interconnect 404 (Vout_int1). The output of drivers 101, 102, and 103 are Vin1*d*, Vin2*d*, and Vin3*d*, respectively. Interconnect 404 can be used on any suitable metal layer. In some embodiments, interconnect 404 comprises a material which includes one or more of: Cu, Al, Ag, Au, Co, or W. In some embodiments, capacitors C1 (401), C2 (402), and C3 (403) are formed in the backend of the die. In some embodiments, capacitors C1 (401), C2 (402), and C3 (403) are formed in the frontend of the die. Interconnect 404 is coupled to a first terminal of non-linear polar capacitor 105. In this example, capacitor 105 comprises ferroelectric material and hence is labeled as $C_{FE}$. However, other non-linear polar material described herein can be used to fabricate capacitor 105. The second terminal of capacitor 105 is coupled to node n1 (Vout_int2).

In some embodiments, capacitor 105 is a pillar capacitor. A pillar capacitor is taller than its width and allows for compact layout in the z-direction. In one embodiment, capacitors C1 (401), C2 (402), and C3 (403) are fabricated below or under pillar capacitor forming a vertical majority gate.

Figure 5:
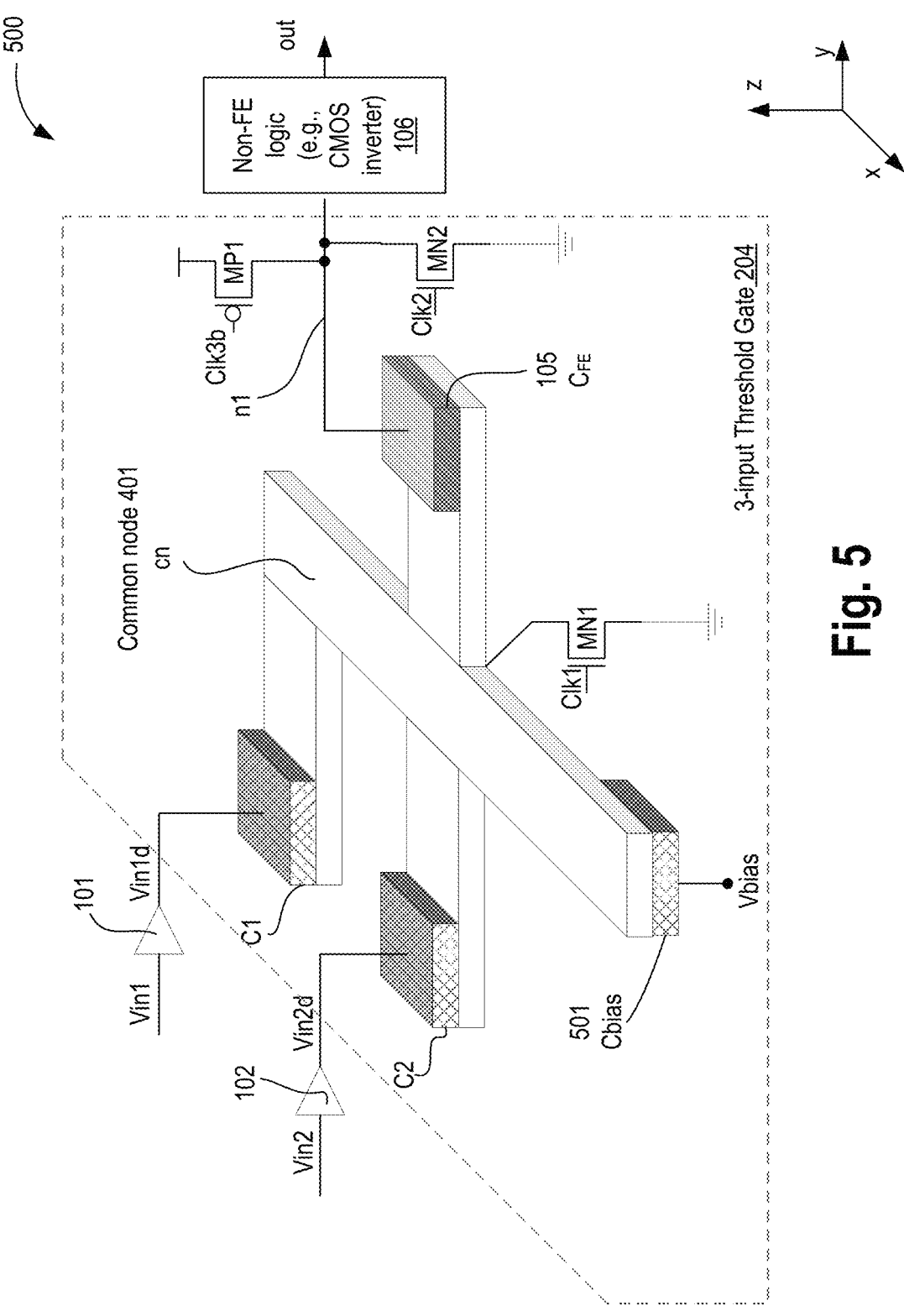
FIG. 5 illustrates combinational logic including the logic gate of FIG. 1B with a 3D view of the 3-input threshold gate that couples to an inverter or buffer, in accordance with some embodiments.

FIG. 5 illustrates combination logic 500 having logic gate of FIG. 1B with a 3D view of the 3-input threshold gate that couples to an inverter or buffer, in accordance with some embodiments. Here, 3-input threshold gate 204 is similar to majority gate of FIG. 4 but for removing capacitor C3 and its associated input and adding an extra capacitor 501 Cbias which is biased by Vbias. Vbias can be positive or negative. The various embodiments described with reference to FIG. 1B and FIG. 4 are applicable here. Any of the reset mechanisms described herein (e.g., with reference to FIGS. 1A-I) are applicable to logic 500.

Figure 6A:
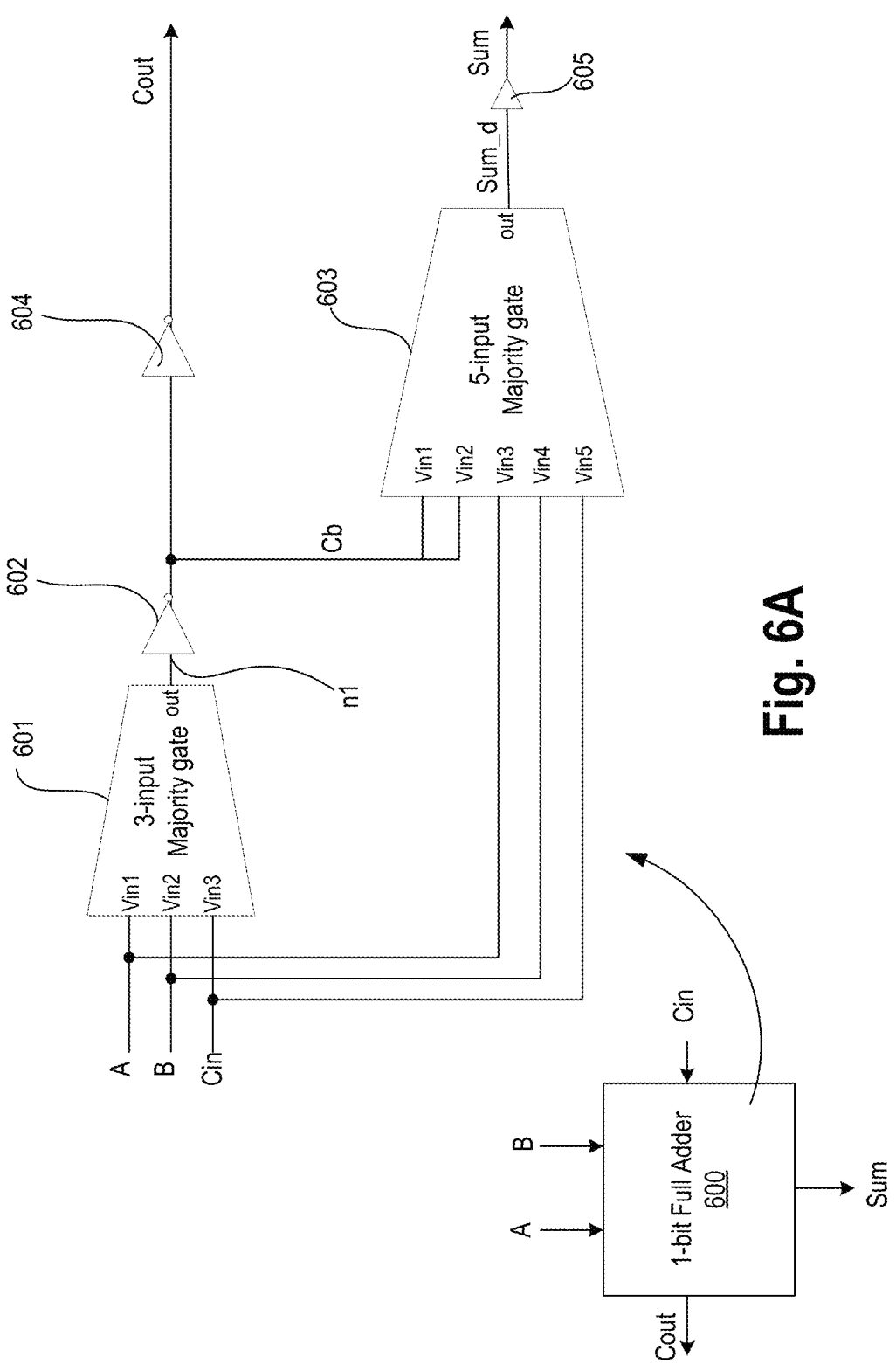
FIG. 6A illustrates a 1-bit full adder comprising a 3-input majority gate and a 5-input majority gate, in accordance with some embodiments.

FIG. 6A illustrates a 1-bit full adder 600 comprising a 3-input majority gate and a 5-input majority gate, in accordance with some embodiments. A full adder adds binary numbers and accounts for values carried in as well values that are output. A one-bit full-adder adds three one-bit numbers, A, B, and $C_{in}$, where A and B are the operands, and $C_{in}$ is a bit carried in from the previous less significant stage. However, the embodiments are not limited to the inputs being binary. In some embodiments, the inputs are analog signals. The full adder is usually a component in a cascade of adders, which add 8, 16, 32, etc. bit binary numbers. The circuit produces a 2-bit output, with are carry out Cout, and sum. The sum is typically represented by the signals $C_{out}$ and S, where the sum equals $2C_{out}+S$. Implementing a 1-bit adder with complementary metal oxide semiconductor (CMOS) logic requires many logic gates such as AND logic gate, OR logic gate, inverters, and sometime state elements such as flip-flops.

In some embodiments, 1-bit adder is implemented with 3-input majority gate 601, inverter 602, 5-input majority gate 603, inverter 604, and buffer 605. An output n1 from 3-input majority gate 601 is inverted by inverter 602. The inverted output Cb is input two times (as inputs Vin1 and Vin2) to 5-input majority gate 603. To keep the polarity of Cout correct, an additional inverter 604 drives the output of Cb as Cout. Other inputs (A, B, and Cin) to the 5-input majority gate are same as those of the 3-input majority gate. The output Sum_d of the 5-input majority gate 604 is a sum while the output of the 3-input majority gate 601 is the carry. In various embodiments, the output Sum_d is buffered by buffer 605 to generate the final Sum for driving to a next stage. Table 5 illustrates the truth table of the 1-bit full adder.

TABLE 5

| | Inputs | | Outputs | |
|---|---|---|---|---|
| | | | Carry out | |
| A | B | Cin | (Cout) | Sum |
| 0 | 0 | 0 | 0 | 0 |
| 0 | 0 | 1 | 0 | 1 |
| 0 | 1 | 0 | 0 | 1 |

TABLE 5-continued

| | Inputs | | Outputs | |
| | | | Carry out | |
| A | B | Cin | (Cout) | Sum |
| --- | --- | --- | --- | --- |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

The 1-bit full adder 600 of FIG. 6A is scaled down to eight capacitors that can be fabricated or positioned in the backend of the die. The active devices or transistors of inverters 602 and 604, and buffer 605 can be fabricated in the frontend or backend depending on the transistor technology. While each majority gate is shown to have two additional transistors MN1 and MN2 to discharge common node cn and node n1, these transistors can be shared between the two majority gates 601 and 603. In some embodiments, a single transistor MN (or a p-type transistor, not shown) can be used to pre-discharge (or pre-charge if a p-type transistor is used) common node cn and node n1 for both majority gates 601 and 603. As such, nine transistors can implement a 1-bit full adder, which is much smaller in area and power footprint than traditional CMOS based 1-bit full adders.

Another way to describe the 1-bit full-adder is in view of linear and non-linear outputs generated by various circuities of 1-bit full-adder 600. In some embodiments, adder 600 comprises 3-input majority gate 601 including a first circuitry (e.g., interconnects and capacitors C1, C2, and C3) to receive at least three signals (A, B, and Cin) and apply linear summation to the at least three signals, and generate a first summed output on node cn. In various embodiments, A, B, and Cin are driven by CMOS drivers with full rail-to-rail signaling. The 3-input majority gate 601 comprises a second circuitry (e.g., interconnect cn, capacitor 105) to receive the first summed output (e.g., voltage and/or current on node cn) and apply non-linear function via a first FE material (e.g., by capacitor 105), wherein the second circuitry to generate a first non-linear output (e.g., on node n1) compared to the first summed output (e.g., on node cn). Adder 600 further comprises an inverting logic gate 603 to convert the first non-linear output to a first output Cb, wherein the first output is an inversion of the first non-linear output. The inverting logic gate 603 can be an inverter, an NAND gate, or an NOR gate, wherein the NAND and NOR gates are configured as inverters and are capable of disabling the signal path.

Adder 600 further comprises a 5-input majority gate 603 coupled to the inverting logic gate 602. The 5-input majority gate 603 comprises a third circuitry (e.g., interconnects and capacitors C1, C2, C3, C4, and C5) to receive at least five signals including the at least three signals (e.g., A, B, and Cin) and two inverted first outputs (2× Cb), and apply linear summation to the at least five signals, and generate a second summed output on a common node. The 5-input majority gate 603 comprises a fourth circuitry (e.g., the common node and capacitor 105) to receive the second summed output and apply non-linear function via a second FE material, wherein the fourth circuitry to generate a second non-linear output compared to the second summed output. The output voltage developed on the second FE material is the summed output which can be buffered by buffer 605.

Figure 6B:
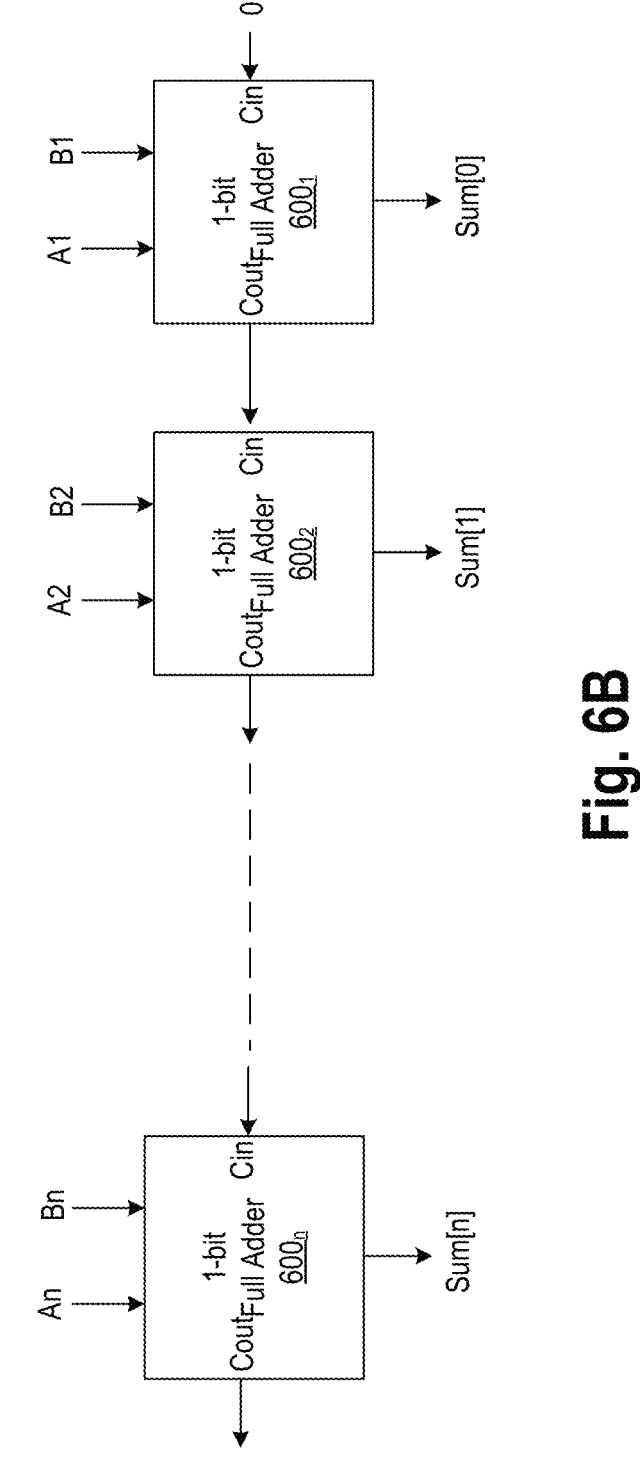
FIG. 6B illustrates an N-bit full adder comprising N 1-bit full-adders, where each 1-bit full adder includes a 3-input majority gate and a 5-input majority gate, in accordance with some embodiments.

FIG. 6B illustrates N-bit full adder 620 comprising N 1-bit full-adders, where each 1-bit full adder includes a 3-input majority gate and a 5-input majority gate, in accordance with some embodiments. Here, multiple 1-bit adders $600_1$ through $600_n$ are concatenated to form N-bit adder 620. Each adder receives its corresponding inputs, and provides the carry Cout to the subsequent stage. For example, adder $600_1$ receives A1 and B1 as inputs with carry-in bit Cin set to logical 0, adder $600_2$ receives A2 and B2 as inputs with carry-in bit Cin provided from carryout Cout of adder $600_1$, and adder $600_n$ receives An and Bn as inputs with carry-in bit Cin provided from carryout Cout of adder $600_{n-1}$.

Figure 6C:
FIG. 6C illustrates a serial adder comprising the majority gate based 1-bit full adder, in accordance with some embodiments.
Figure 6C:
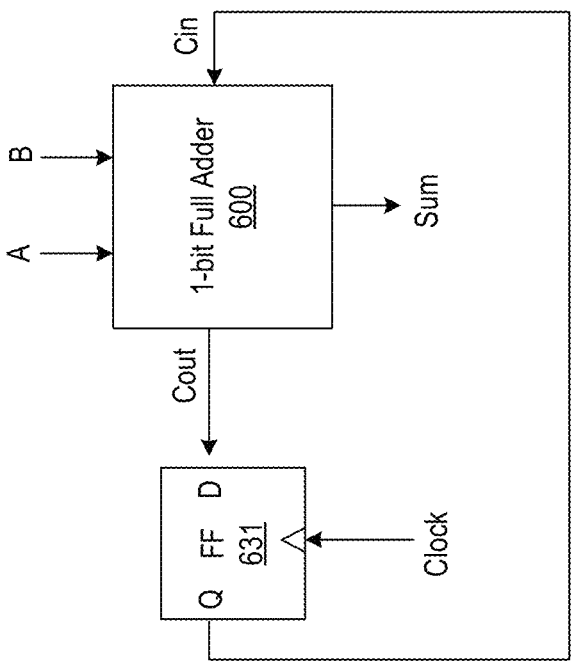

FIG. 6C illustrates serial adder 630 comprising the majority gate based 1-bit full adder, in accordance with some embodiments. Serial adder 630 comprises majority gate based 1-bit full adder 600 coupled to a sequential circuit 631. In some embodiments, the sequential circuit comprises a flip-flop (FF). The output 'Q' of flip-flop 631 is coupled to carry-in input Cin of adder 600. The output Cout of adder 600 is coupled to the input 'D' of FF 631. Any suitable clock can be used to sample Cout by FF 631.

Figure 6D:
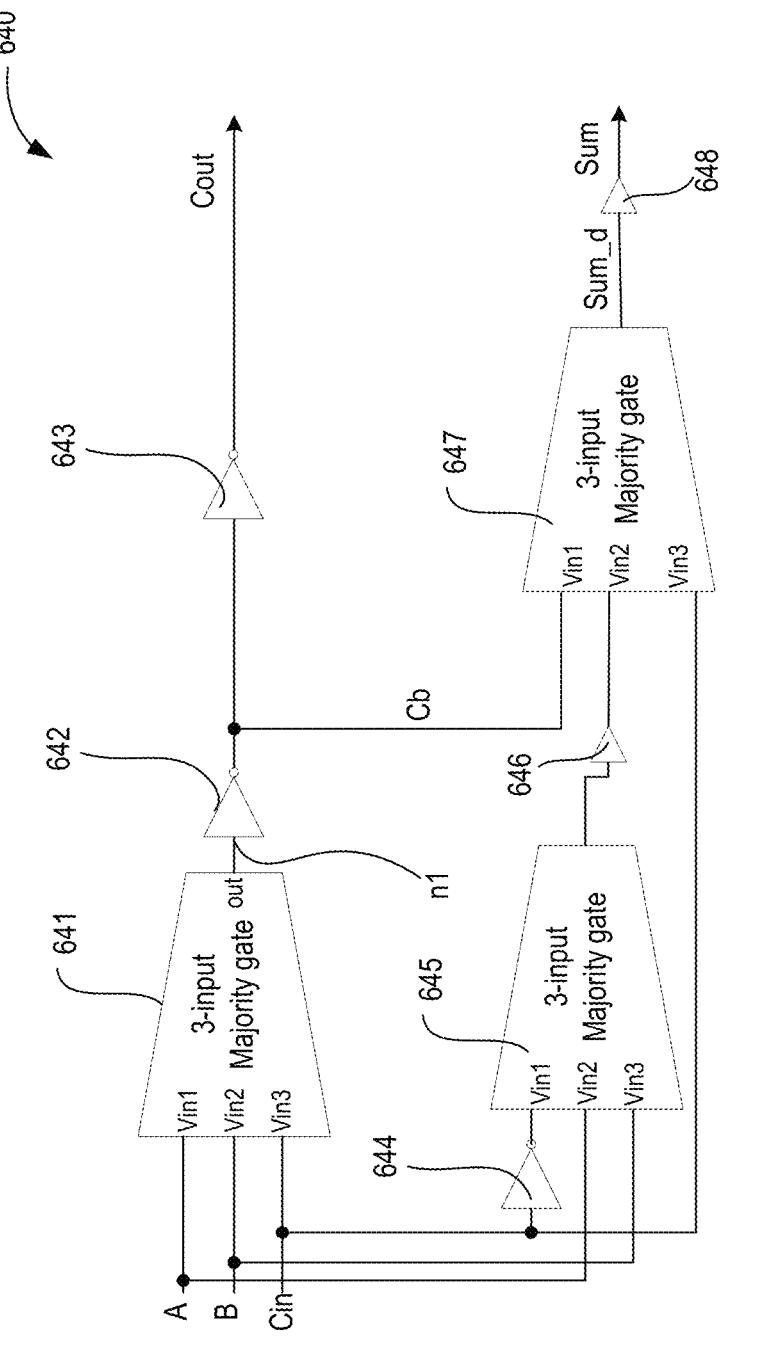
FIG. 6D illustrates 1-bit full adder, in accordance with some embodiments.

FIG. 6D illustrates 1-bit full adder 640, in accordance with some embodiments. Adder 640 is another version of adder 600. Adder 640 comprises first 3-input majority gate 641, inverter 642, inverter 643, inverter 644, second 3-input majority gate 645, buffer 646, and third 3-input majority gate 647 coupled as shown. The first 3-input majority gate 641 generates the carry-out signal, which is inverted and provided as input to the third 3-input majority gate 647. The output of the 3-input majority gate is the sum. The third 3-input majority gate receives the carry-in input and an output of the second 3-input majority gate 645. The second 3-input majority gate receives inputs A and B, and an inverted version of carry-in.

Figure 7:
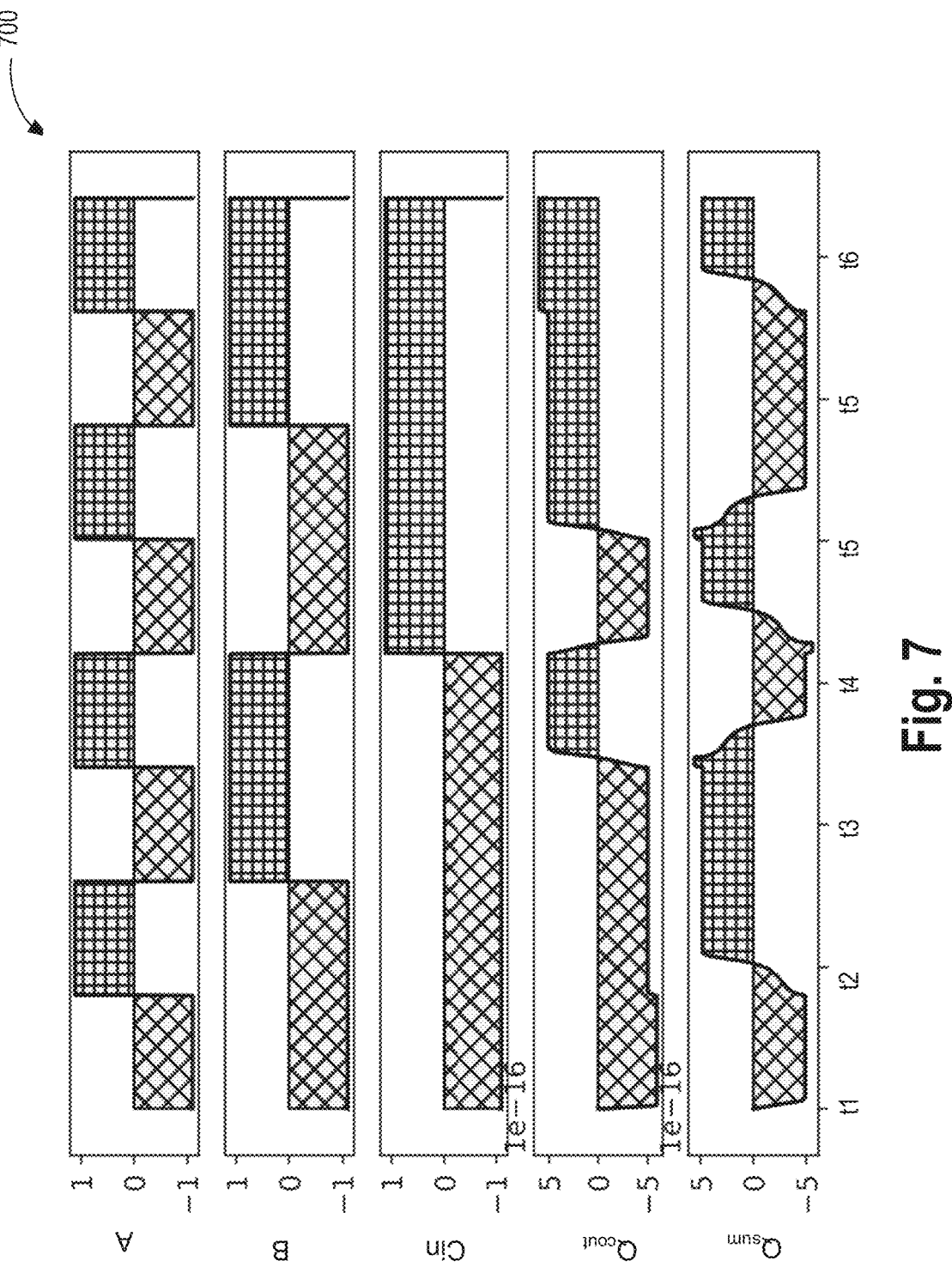
FIG. 7 illustrates a plot showing operation of a 1-bit full adder, in accordance with some embodiments.

FIG. 7 illustrates plot 700 showing operation of 1-bit full adder of FIG. 6A, in accordance with some embodiments. The waveforms show the various input combinations of Table 5, and the outputs Cin and Sum.

Figure 8:
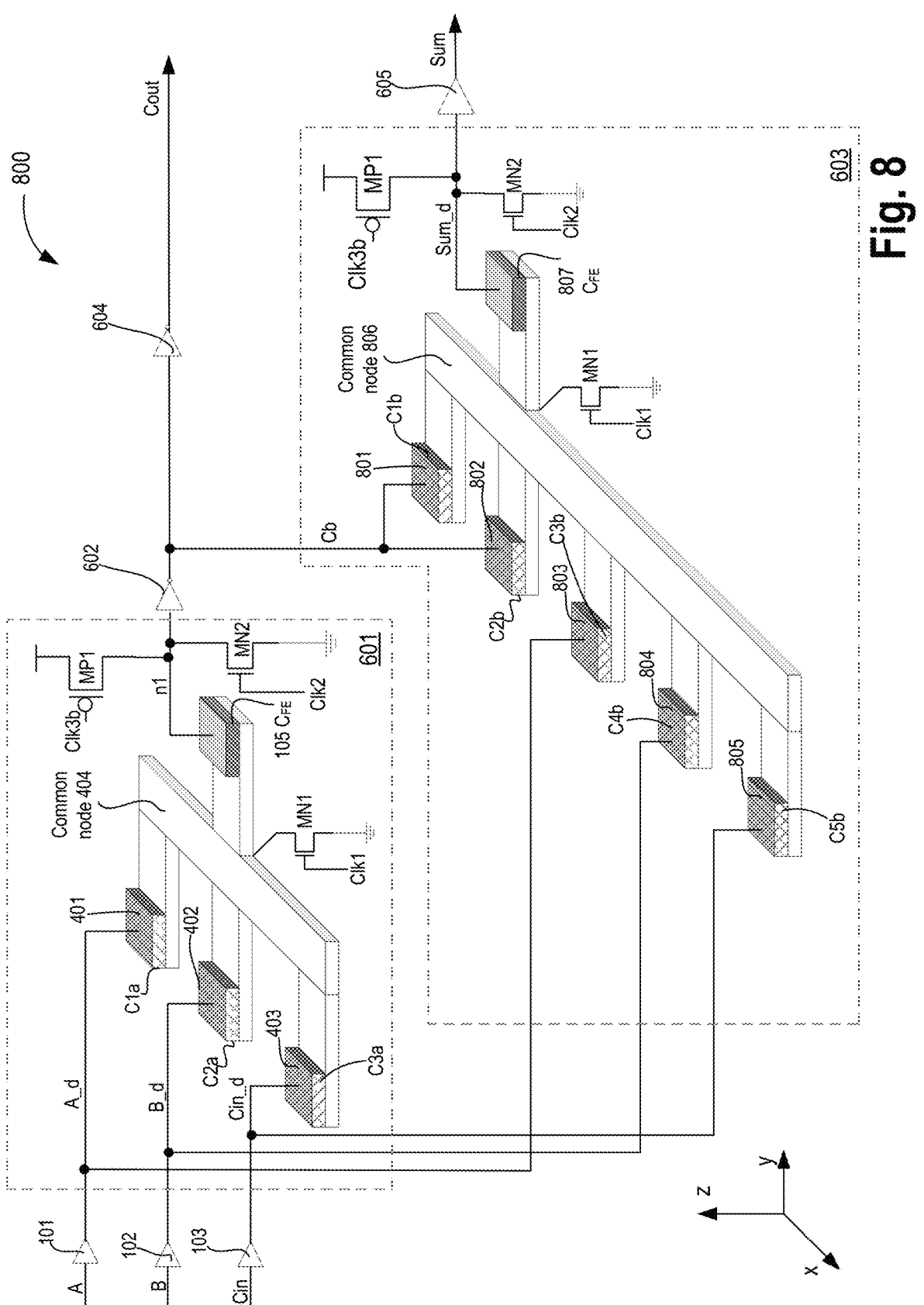
FIG. 8 illustrates a 3-D view of a 1-bit full adder, in accordance with some embodiments.

FIG. 8 illustrates a 3-D view 800 of a 1-bit full adder, in accordance with some embodiments. Here inputs A, B, and Cin are driven by buffers 101, 102, and 103, respectively. These buffers may or may not be part of the adder since these inputs are driven by another logic block (not shown). The 3-input majority gate receives inputs A_d, B_d, and Cin_d, which are buffered versions of input signals A, B, and Cin. In this example, capacitors C1a (401), C2a (402), and C3a (403) are MIM capacitors that receive the inputs A_d, B_d, and Cin_d, respectively, on their first terminals. However, other types of capacitors can be used. For example, hybrid of metal and transistor can be used to implement the capacitor.

The second terminals of capacitors C1a (401), C2a (402), and C3a (403) are coupled to common node cn interconnect 404. Interconnect 404 can be on any suitable metal layer. In some embodiments, interconnect 404 comprises a material which includes one or more of: Cu, Al, Ag, Au, Co, or W. In some embodiments, capacitors C1a (401), C2a (402), and C3 (403) are formed in the backend of the die. In some embodiments, capacitors C1a (401a), C2a (402), and C3a (403) are formed in the frontend of the die. Interconnect 404 is coupled to a first terminal of non-linear polar capacitor 105. In this example, capacitor 105 comprises ferroelectric material and hence labeled as $C_{FE}$. However, other non-linear polar material described herein can be used to fabricate capacitor 105. The second terminal of capacitors 105 is coupled to node n1.

In some embodiments, capacitor 105 is a pillar capacitor. A pillar capacitor is taller than its width and allows for compact layout in the z-direction. In one embodiment, capacitors C1a (401a), C2a (402a), and C3a (403a) are fabricated below or under pillar capacitors forming a vertical majority gate.

The voltage on node n1 is the carry out signal, which is inverted by inverter 602 and driven as Cb to capacitors C1b and C2b. Other capacitors C3b, C4b, and C5b of the 5-input majority gate receive inputs A_d, B_d, and Cin_d, respectively.

In this example, capacitors C1b (801), C2b (802), C3b (803), C4b (804), and C5b (805) are MIM capacitors that receive the inputs A_d, B_d, and Cin_d, respectively, on their first terminals. However, other types of capacitors can be used. For example, hybrid of metal and transistor can be used to implement the capacitor. The second terminals of capacitors C1b (801), C2b (802), C3b (803), C4b (804), and C5b (805) are coupled to common node interconnect 806. Interconnect 806 can be on any suitable metal layer. In some embodiments, interconnect 806 comprises a material which includes one or more of: Cu, Al, Ag, Au, Co, or W. In some embodiments, capacitors C1b (801), C2b (802), C3b (803), C4b (804), and C5b (805) are formed in the backend of the die. In some embodiments, capacitors C1b (801), C2b (802), C3b (803), C4b (804), and C5b (805) are formed in the frontend of the die. Interconnect 806 is coupled to a first terminal of non-linear polar capacitor 807. In this example, capacitor 807 comprises ferroelectric material and hence is labeled as CHE. However, other non-linear polar material described herein can be used to fabricate capacitor 807. The second terminal of capacitor 807 is coupled to node Sum_d. Buffer 605 drives Sum_d as Sum.

Figure 9:
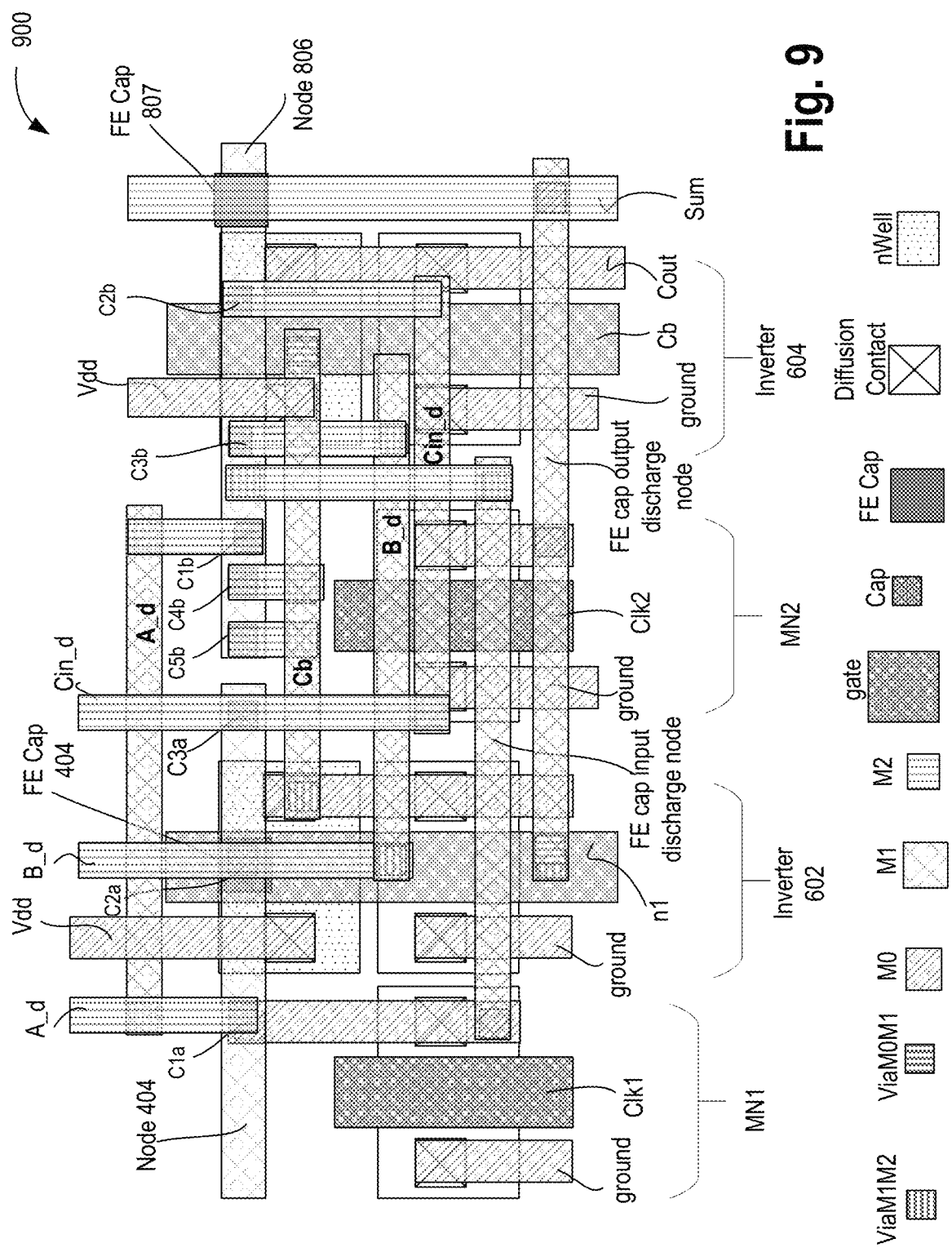
FIG. 9 illustrates a top-down layout of a 1-bit full adder, in accordance with some embodiments.

FIG. 9 illustrates a top-down layout 900 of a 1-bit full adder, in accordance with some embodiments. Layout 900 illustrates a compact layout of 1-bit full adder 600 with a pitch of four minimum sized transistors. The pitch can be further reduced to two minimum sized transistors if transistors MN1 is used to pre-discharge nodes cn 404 and 806 n1 for both the 3-input majority gate 601 and the 5-input majority gate 602. Non-ferroelectric capacitors C1, C2, C3, C4, and C5 and non-linear polar capacitors (FE cap) are positioned in the place of via for metal layer 1 (M1) to metal layer 2 (M2). Transistors MN1, MN2, and inverters 602 and 604 are in the frontend of the die. Inputs A, B, and Cin are on metal layer M2. Common nodes cn 404 and 804 are on metal layer M1. While non-ferroelectric capacitors C1, C2, C3, C4, and C5, and non-linear polar capacitors (FE cap) are positioned in location of ViaM1M2, they can then be further located in the backend of the die. For example, non-ferroelectric capacitors C1, C2, C3, C4, and C5 and the non-linear polar capacitors (FE cap) can be positioned in ViaM4M5 or higher. As such, lower metal layers are freed up for routing of other signals.

Transistors MN1 and MN2, and other inverters, such as 602 and 604, can be planar or non-planar transistors. In some embodiments, transistors MN1 and MN2, and other inverters 602 and 604, can be formed in the frontend or backend. In some embodiments, one or more of non-ferroelectric capacitors C1, C2, C3, C4, and C5 and non-linear polar capacitor (FE cap) are formed in the frontend or backend. While transistors MN1 and MN2 are illustrated as n-type transistors, they can be replaced with p-type transistors. In that case, nodes cn 404/806 and n1/sum_d are pre-charged to a predetermined or programmable voltage. The transistors here can be Square Wire, Rectangular Ribbon Transistors, Gate All Around Cylindrical Transistors, Tunneling FETs (TFET), ferroelectric FETs (FeFETs), bipolar transistors (BJT), BiCMOS, or other devices implementing transistors functionality, for instance, carbon nanotubes or spintronic devices. In some embodiments, the transistors are typical metal oxide semiconductor (MOS) transistors or their derivatives including Tri-Gate and FinFET transistors. While MOSFET have symmetrical source and drain terminals, TFET device has asymmetric source and drain terminals. Any of the reset mechanisms described herein (e.g., with reference to FIGS. 1A-I) are applicable to the various embodiments.

Figure 10:
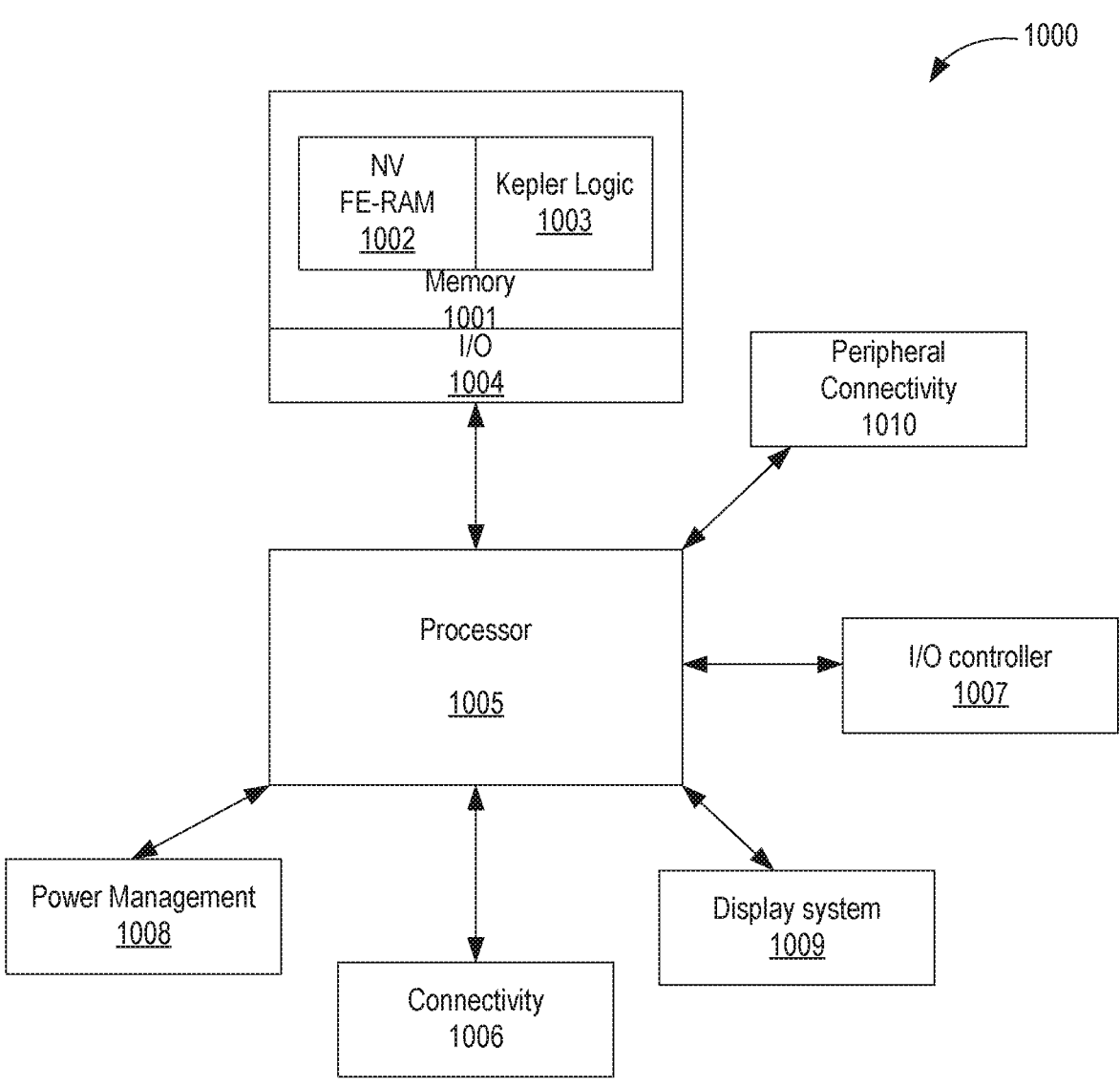
FIG. 10 illustrates a system-on-chip (SOC) that includes a 1-bit full adder, in accordance with some embodiments.

FIG. 10 illustrates a system-on-chip (SOC) 1000 that includes a 1-bit full adder, in accordance with some embodiments. SOC 1000 comprises memory 1001 having static random-access memory (SRAM) or FE based random access memory FE-RAM, or any other suitable memory. The memory can be non-volatile (NV) or volatile memory. Memory 1001 may also comprise logic 1003 to control memory 1002. For example, write and read drivers are part of logic 1003. These drivers and other logic are implemented using the majority or threshold gates of various embodiments. The logic can comprise majority or threshold gates and traditional logic (e.g., CMOS based NAND, NOR etc.). Any block of SOC 1000 can include the 1-bit full adder described with reference to the various embodiments.

SOC further comprises a memory I/O (input-output) interface 1004. The interface may be double-data rate (DDR) compliant interface or any other suitable interface to communicate with a processor. Processor 1005 of SOC 1000 can be a single core or multiple core processor. Processor 1005 can be a general-purpose processor (CPU), a digital signal processor (DSP), or an Application Specific Integrated Circuit (ASIC) processor. In some embodiments, processor 1005 is an artificial intelligence (AI) processor (e.g., a dedicated AI processor, a graphics processor configured as an AI processor).

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 405 has reduced latency of computing the training model and using the training model, which reduces the power consumption of such AI processor systems.

Processor 1005 may be coupled to a number of other chiplets that can be on the same die as SOC 1000 or on separate dies. These chiplets include connectivity circuitry 1006, I/O controller 1007, power management 1008, display system 1009, and peripheral connectivity 1010.

Connectivity 1006 represents hardware devices and software components for communicating with other devices. Connectivity 1006 may support various connectivity circuitries and standards. For example, connectivity 1006 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 1006 may support non-cellular standards such as WiFi.

I/O controller 1007 represents hardware devices and software components related to interaction with a user. I/O controller 1007 is operable to manage hardware that is part of an audio subsystem and/or display subsystem. For example, input through a microphone or other audio device can provide input or commands for one or more applications or functions of SOC 1000. In some embodiments, I/O controller 1007 illustrates a connection point for additional devices that connect to SOC 1000 through which a user might interact with the system. For example, devices that can be attached to the SOC 1000 might include microphone devices, speaker or stereo systems, video systems or other display devices, keyboard or keypad devices, or other I/O devices for use with specific applications such as card readers or other devices.

Power management 1008 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1008 may accordingly put such logic into low power state without the worry of losing data. Power management may select a power state according to Advanced Configuration and Power Interface (ACPI) specification for one or all components of SOC 1000.

Display system 1009 represents hardware (e.g., display devices) and software (e.g., drivers) components that provide a visual and/or tactile display for a user to interact with the processor 1005. In some embodiments, display system 1009 includes a touch screen (or touch pad) device that provides both output and input to a user. Display system 1009 may include a display interface, which includes the particular screen or hardware device used to provide a display to a user. In some embodiments, the display interface includes logic separate from processor 1005 to perform at least some processing related to the display.

Peripheral connectivity 1010 may represent hardware devices and/or software devices for connecting to peripheral devices such as printers, chargers, cameras, etc. Peripheral connectivity 1010 supports communication protocols, e.g., PCIe (Peripheral Component Interconnect Express), USB (Universal Serial Bus), Thunderbolt, High Definition Multimedia Interface (HDMI), Firewire, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (e.g., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a 3-input majority logic gate comprising: first, second, and third capacitors to receive a first input, a second input, and a third input, respectively; and a first non-linear polar capacitor to store a majority function output of the first, second, and third inputs, wherein one terminal of the FE capacitor provides an output of the 3-input majority logic gate; an inverting logic coupled to the output of the 3-input majority logic gate, and to generate an inversion of the output of the 3-input majority logic gate; and a 5-input majority logic gate coupled to an output of the inverting logic, the 5-input majority logic gate comprising: first, second, third, fourth, and fifth capacitors to receive the inversion of the output of the 3-input majority gate logic, the inversion of the output of the 3-input majority gate logic, the first, second, and third inputs of the 3-input majority logic gate, respectively, and a second non-linear polar capacitor to store a majority function output of the first, second, and third inputs of the 3-input majority logic gate, and two times the inversion of the output of the 3-input majority gate logic.

Example 2: The apparatus of example 1, wherein the inverting logic is a first inverting logic, and wherein the apparatus comprises a second inverting logic having an input coupled to an output of the first inverting logic, wherein an output of the second inverting logic is a carryout of a 1-bit adder.

Example 3: The apparatus of example 1, comprising a buffer having an input coupled to the second non-linear polar capacitor, wherein an output of the buffer is a sum of a 1-bit adder.

Example 4: The apparatus of example 1, comprising: a first transistor coupled to a first terminal of the first non-linear polar capacitor, wherein first transistor is controllable by a first clock; and a second transistor coupled to a second terminal of the first FE non-linear polar capacitor, wherein the second transistor is controllable by a second clock.

Example 5: The apparatus of example 2, comprising: a third transistor coupled to a first terminal of the second non-linear polar capacitor, wherein third transistor is controllable by the first clock; and a fourth transistor coupled to a second terminal of the second non-linear polar capacitor, wherein the fourth transistor is controllable by the second clock.

Example 6: The apparatus of example 1 comprises: a first driver to generate the first input; a second driver to generate the second input; and a third driver to generate the third input.

Example 7: The apparatus of example 6, wherein the first, second, and third drivers comprise CMOS transistors.

Example 8: The apparatus of example 1, wherein the inverting logic comprise one of: a buffer, a CMOS inverter, an NAND gate, or an NOR gate.

Example 9: The apparatus of example 1, wherein the first, second, and third capacitors of the 3-input majority logic gate comprises one of: metal-insulator-metal (MIM) capacitor, transistor gate capacitor, hybrid of metal and transistor capacitor; or capacitor comprising paraelectric material.

Example 10: The apparatus of example 1, wherein the first and second non-linear polar capacitors includes one of: a ferroelectric material, a paraelectric material, or a non-linear dielectric.

Example 11: The apparatus of example 10, wherein the ferroelectric material includes one of: bismuth ferrite (BFO) or BFO with a first doping material where in the first doping material is one of lanthanum, or elements from lanthanide series of periodic table; lead zirconium titanate (PZT) or PZT with a second doping material, wherein the second doping material is one of La or Nb; a relaxor ferroelectric, which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), barium titanium-barium strontium titanium (BT-BST); a perovskite ferroelectric, which includes one of: BaTiO3, PbTiO3, KNbO3, or NaTaO3; a hexagonal ferroelectric which includes one of: YMnO3 or LuFcO3; hexagonal ferroelectrics of a type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides of the form, Hf1-x Ex Oy where E can be Al, Ca, Cc, Dy, Er, Gd, Ge, La, Sc, Si, Sr, Sn, Y;

Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, potassium strontium niobate; or an improper ferroelectric which includes one of: [PTO/STO]n or [LAO/STO]n, where 'n' is between 1 and 100.

Example 12: The apparatus of example 1, wherein the first, second, and third signals are analog signals, digital signals, or a combination of them.

Example 13: The apparatus of example 1, wherein the first and second non-linear polar capacitors are positioned in a backend of a die, while transistors of the inverting logic are positioned in a frontend of a die.

Example 14: An apparatus comprising: a first multi-input majority logic gate comprising three first non-ferroelectric capacitors to receive three signals, and a first ferroelectric (FE) capacitor to store a majority function of the three signals; and an inverter coupled to an output of the first multi-input majority logic gate, wherein the output is coupled to a terminal of the first FE capacitor, wherein the inverter provides an inverted output of the first multi-input majority logic gate; and a second multi-input majority logic gate coupled to the inverter, the second multi-input majority logic gate comprising second five non-FE capacitors to receive the three signals and two of the inverted output of the first multi-input majority logic gate, respectively, and a second FE capacitor to store a majority function of the three signals and two of the inverted output of the first multi-input majority logic gate.

Example 15: The apparatus of example 14, wherein the three signals are digital signals, analog signals or a combination of them.

Example 16: The apparatus of example 14, wherein the three non-FE capacitors of the first multi-input majority logic gate and the five non-FE capacitors of the second multi-input majority gate comprises one of: a metal-insulator-metal (MIM) capacitor, a transistor gate capacitor, a hybrid of metal and transistor capacitor; a capacitor comprising paraelectric material; a non-linear dielectric capacitor, or a linear dielectric capacitor.

Example 17: The apparatus of example 14, wherein the first and second FE capacitors includes one of: bismuth ferrite (BFO) or BFO with a first doping material where in the first doping material is one of lanthanum or elements from lanthanide series of periodic table; lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), barium titanium-barium strontium titanium (BT-BST); a perovskite which includes one of: BaTiO3, PbTiO3, KNbO3, or NaTaO3; a hexagonal ferroelectric which includes one of: YMnO3, or LuFcO3; hexagonal ferroelectrics of a type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides of the form, Hf1-x Ex Oy where E can be Al, Ca, Ce, Dy, er, Gd, Ge, La, Sc, Si, Sr, Sn, Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, potassium strontium niobate; or an improper ferroelectric which includes one of: [PTO/STO]n or [LAO/STO]n, where 'n' is between 1 and 100.

Example 18: The apparatus of example 14 comprising: a first pull-down device to discharge a first node coupled to a first terminal of the first FE capacitor, and a second node coupled to a first terminal of the second FE capacitor; and a second pull-down device to discharge a second terminal of the first FE capacitor, and a second terminal of the second FE capacitor.

Example 19: An apparatus comprising: a 3-input majority gate including: a first circuitry to receive at least three signals and apply linear summation to the at least three signals, and generate a first summed output; a second circuitry to receive the first summed output and apply non-linear function via a first FE material, wherein the second circuitry to generate a first non-linear output compared to the first summed output; and a inverting logic gate to convert the first non-linear output to a first output, wherein the first output is an inversion of the first non-linear output; and a 5-input majority gate coupled to the inverting logic gate, the 5-input majority gate comprising: a third circuitry to receive at least five signals including the at least three signals and two inverted first outputs, and apply linear summation to the at least five signals, and generate a second summed output; and a fourth circuitry to receive the second summed output and apply non-linear function via a second FE material, wherein the fourth circuitry to generate a second non-linear output compared to the second summed output.

Example 18: The apparatus of example 19, wherein the first circuitry comprises first, second, and third non-FE capacitors to receive the at least three signals, respectively, wherein the third circuitry comprises first, second, third, fourth, and fifth non-FE capacitors to receive the at least three signals and two inverted first outputs, respectively.

Example 19: The apparatus of example 23, wherein the second circuitry comprises a capacitor including the first FE material to store the first summed output, wherein the fourth circuitry comprises a capacitor including the second FE material to store the second summed output.

Example 20: The apparatus of example 23, wherein the inverting logic gate comprises one of: an inverter, an NAND gate, or an NOR gate.

Example 21: A system comprising: a processor; a communication interface communicatively coupled to the processor; and a memory coupled to the processor, wherein the processor comprises a majority gate logic which includes: a 3-input majority logic gate comprising: first, second, and third non-ferroelectric capacitors to receive a first input, a second input, and a third input, respectively; and a first non-linear polar capacitor to store a majority function output of the first, second, and third inputs, wherein one terminal of the FE capacitor provides an output of the 3-input majority logic gate; an inverting logic coupled to the output of the 3-input majority logic gate, and to generate an inversion of the output of the 3-input majority logic gate; and a 5-input majority logic gate coupled to an output of the inverting logic, the 5-input majority logic gate comprising: first, second, third, fourth, and fifth non-ferroelectric capacitors to receive the inversion of the output of the 3-input majority gate logic, the inversion of the output of the 3-input majority gate logic, the first, second, and third inputs of the 3-input majority logic gate, respectively, and a second non-linear polar capacitor to store a majority function output of the first, second, and third inputs of the 3-input majority logic gate, and two times the inversion of the output of the 3-input majority gate logic.

Example 22: The system of example 21, wherein the first and second ferroelectric capacitors includes one of: bismuth ferrite (BFO) or BFO with a first doping material where in the first doping material is one of lanthanum, or elements from lanthanide series of periodic table; lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); perovskite includes one of: BaTiO3, PbTiO3, KNbO3, or NaTaO3; hexagonal ferroelectric which includes one of: YMnO3, or LuFcO3; hexagonal ferroelectrics of a type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides of the form. Hf1-x Ex Oy where E can be Al, Ca, Ce, Dy, er, Gd, Ge, La, Sc, Si, Sr, Sn, Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, potassium strontium niobate; or an improper ferroelectric which includes one of: [PTO/STO]n or [LAO/STO]n, where 'n' is between 1 and 100.

Example 23: An apparatus comprising: a 3-input majority logic gate comprising: first, second, and third capacitors to receive a first input, a second input, and a third input, respectively; and a first non-linear polar capacitor to store a majority function output of the first, second, and third inputs, wherein one terminal of the first non-linear polar capacitor provides an output of the 3-input majority logic gate; a first inverting logic coupled to the output of the 3-input majority logic gate, and to generate an inversion of the output of the 3-input majority logic gate; a 5-input majority logic gate coupled to an output of the inverting logic, the 5-input majority logic gate comprising: first, second, third, fourth, and fifth capacitors to receive the inversion of the output of the 3-input majority gate logic, the inversion of the output of the 3-input majority gate logic, the first, second, and third inputs of the 3-input majority logic gate, respectively, and a second non-linear polar capacitor to store a majority function output of the first, second, and third inputs of the 3-input majority logic gate, and two times the inversion of the output of the 3-input majority gate logic; and a second inverting logic having an input coupled to an output of the first inverting logic, wherein an output of the second inverting logic is a carryout of a 1-bit adder.

Example 24: The apparatus of example 23, comprising a flip-flop having an input coupled to an output of the second inverting logic, wherein an output of the flip-flop is coupled to the third input of the 3-input majority gate and the fifth capacitor of the 5-input majority logic gate.

Example 24: The apparatus of example 24, comprising a buffer coupled to the output of the flip-flop and to the third input of the 3-input majority gate and the fifth capacitor of the 5-input majority logic gate.

Example 25: The apparatus of example 23, comprising a buffer having an input coupled to the second non-linear polar capacitor, wherein an output of the buffer is a sum of a 1-bit adder.

Example 26: The apparatus of example 23, comprising: a first transistor coupled to a first terminal of the first non-linear polar capacitor, wherein first transistor is controllable by a first clock; a second transistor coupled to a second terminal of the first non-linear polar capacitor, wherein the second transistor is controllable by a second clock; and a third transistor coupled to the second terminal of the non-linear polar capacitor, wherein the third transistor is controllable by third clock.

Example 27: The apparatus of example 26, wherein first clock has a pulse width greater than a pulse width of the second clock and a pulse width of the third clock.

Example 27: The apparatus of example 26, wherein the third clock de-asserts prior to an assertion of the second clock.

Example 28: The apparatus of example 26, wherein the first transistor is a first n-type transistor, wherein the second transistor is a second n-type transistor, and wherein the third transistor is a p-type transistor.

Example 29: The apparatus of example 26, wherein the first transistor, the second transistor, and the third transistor are disabled in an evaluation phase, and enabled in a reset phase, wherein the reset phase is prior to the evaluation phase.

Example 30: The apparatus of example 23, comprises: a first driver to generate the first input; and a second driver to generate the second input.

Example 31: The apparatus of example 30, wherein the first and second drivers comprise CMOS transistors.

Example 32: The apparatus of example 23, wherein the first inverting logic comprise one of: a buffer, a CMOS inverter, a NAND gate, or a NOR gate.

Example 32: The apparatus of example 23, wherein the first, second, and third capacitors of the 3-input majority logic gate comprises one of: a metal-insulator-metal (MIM) capacitor, a transistor gate capacitor, a hybrid of metal and transistor capacitor, or a capacitor comprising paraelectric material.

Example 33: The apparatus of example 23, wherein the first and second non-linear polar capacitors includes one of: ferroelectric material, para-electric material, or non-linear dielectric material.

Example 34: The apparatus of example 33, wherein the ferroelectric material includes one of: bismuth ferrite (BFO) or BFO with a first doping material where in the first doping material is one of lanthanum or elements from lanthanide series of periodic table; lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite ferroelectric which includes one of: BaTiO3, PbTiO3, KNbO3, or NaTaO3; a hexagonal ferroelectric which includes one of: YMnO3 or LuFcO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), or yttrium (Y); hafnium (Hf), zirconium (Zr), alluminum (Al), silicon (Si), their oxides or their alloyed oxides; Hafnium oxides of the form, $Hf1-x$ $Ex$ $Oy$ where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric which includes one of: [PTO/STO]n or [LAO/STO] n, where 'n' is between 1 and 100.

Example 35: The apparatus of example 23, wherein the first, second, and third signals are analog signals, digital signals, or a combination of them.

Example 36: The apparatus of example 23, wherein the first and second non-linear polar capacitors are positioned in a backend of a die, while transistors of the inverting logic are positioned in a frontend of a die.

Example 37: An apparatus comprising: a first 1-bit full adder comprising at least two majority gates, wherein each majority gate includes a capacitor comprising a non-linear polar material, wherein the first 1-bit full adder includes a first input, a second input, a first carry-in input, a first carry-out output, and a first sum output; and a second 1-bit full adder comprising at least two majority gates, wherein each majority gate includes a capacitor comprising a non-linear polar material, wherein the second 1-bit full adder includes a third input, a fourth input, a second carry-in input, a second carry-out output, and a second sum output; wherein the first carry-in input receives a logical zero, and wherein the second carry-in input is coupled to the first carry-out output.

Example 48: The apparatus of example 37 comprises: a first driver to generate the first input; and a second driver to generate the second input.

Example 49: The apparatus of example 37, wherein the first or second inputs are an analog signal, a digital signal, or a combination of them.

Example 50: The apparatus of example 37, wherein the non-linear polar material includes one of: a ferroelectric material, paraelectric material, or a non-linear dielectric.

Example 51: The apparatus of example 50, wherein the ferroelectric material includes one of: bismuth ferrite (BFO) or BFO with a first doping material where in the first doping material is one of lanthanum, or elements from lanthanide series of periodic table; Lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); perovskite ferroelectrics includes one of: BaTiO3, PbTiO3, KNbO3, or NaTaO3; hexagonal ferroelectric includes one of: YMnO3 or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides, or their alloyed oxides; hafnium oxides of the form. Hf1-x Ex Oy where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric which includes one of: [PTO/STO]n or [LAO/STO]n, where 'n' is between 1 and 100.

Example 52: A system comprising: a processor; a communication interface communicatively coupled to the processor; and a memory coupled to the processor, wherein the processor comprises a serial adder which includes: a 3-input majority logic gate comprising: first, second, and third capacitors to receive a first input, a second input, and a third input, respectively; and a first non-linear polar capacitor to store a majority function output of the first, second, and third inputs, wherein one terminal of the first non-linear polar capacitor provides an output of the 3-input majority logic gate; a first inverting logic coupled to the output of the 3-input majority logic gate, and to generate an inversion of the output of the 3-input majority logic gate; a 5-input majority logic gate coupled to an output of the inverting logic, the 5-input majority logic gate comprising: first, second, third, fourth, and fifth capacitors to receive the inversion of the output of the 3-input majority gate logic, the inversion of the output of the 3-input majority gate logic, the first, second, and third inputs of the 3-input majority logic gate, respectively, and a second non-linear polar capacitor to store a majority function output of the first, second, and third inputs of the 3-input majority logic gate, and two times the inversion of the output of the 3-input majority gate logic; and a second inverting logic having an input coupled to an output of the first inverting logic, wherein an output of the second inverting logic is a carryout of a 1-bit adder.

Example 53: The system of example 52, wherein the processor is an artificial intelligence processor.

Example 54: The system of example 52, wherein the first or second non-linear polar capacitors includes one of: bismuth ferrite (BFO) or BFO with a first doping material where in the first doping material is one of lanthanum, or elements from lanthanide series of periodic table; lead zirconium titanate (PZT) or PZT with a doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite which includes one of: BaTiO3, PbTiO3, KNbO3, or NaTaO3; a hexagonal ferroelectric which includes one of: YMnO3 or LuFeO3; hexagonal ferroelectrics of a type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides of the form, Hf1-x Ex Oy where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, potassium strontium niobate; or an improper ferroelectric which includes one of: [PTO/STO]n or [LAO/STO]n, where 'n' is between 1 and 100.

Example 55: An apparatus comprising: a first 3-input majority gate to receive a first input, a second input, and a carry-in input; a first inversion logic having an input coupled to the carry-in input, and an output; a second 3-input majority gate to receive the first input, the second input, and the output of the first inversion logic; a second inversion logic having an input coupled to an output of the first 3-input majority gate, and an output; a non-inversion logic coupled to an output of the second 3-input majority gate; and a third 3-input majority gate to receive the output of the second inversion logic, the output of the non-inversion logic, and the carry-in input, wherein each of the first, second, and third 3-input majority gates include a capacitor having non-linear polar material.

Example 56: The apparatus of example 55 comprising a third inversion logic having an input coupled to the output of the second inversion logic, and an output which is a carry-out.

Example 57: The apparatus of example 55, wherein the non-inversion logic is a first non-inversion logic, wherein the apparatus comprising a second non-inversion logic coupled to an output of the third 3-input majority gate, wherein an output of the buffer is a sum.

Example 58: The apparatus of example 55, wherein the first 3-input majority gate comprises: first, second, and third capacitors to receive the first input, the second input, and the carry-in input, respectively; a non-linear polar capacitor to store a majority function output of the first, second, and carry-in inputs, wherein one terminal of the non-linear polar capacitor provides an output of the first 3-input majority logic gate; a first transistor coupled to a first terminal of the non-linear polar capacitor, wherein first transistor is controllable by a first clock; and a second transistor coupled to a second terminal of the non-linear polar non-linear polar capacitor, wherein the second transistor is controllable by a second clock; and a third transistor coupled to the second terminal of the non-linear polar capacitor, wherein the third transistor is controllable by third clock.

Example 59: The apparatus of example 58, wherein first clock has a pulse width greater than a pulse width of the second clock and a pulse width of the third clock.

Example 60: The apparatus of example 58, wherein the third clock de-asserts prior to an assertion of the second clock.

Example 61: The apparatus of example 58, wherein the first transistor is a first n-type transistor, wherein the second transistor is a second n-type transistor, and wherein the third transistor is a p-type transistor.

Example 62: The apparatus of example 58, wherein the first transistor, the second transistor, and the third transistor are disabled in an evaluation phase, and enabled in a reset phase, wherein the reset phase is prior to the evaluation phase.

Example 63: The apparatus of example 58, wherein the first and second transistors comprise CMOS transistors.

Example 64: The apparatus of example 58, wherein the first, second, and third capacitors of the first 3-input majority logic gate comprises one of: a metal-insulator-metal (MIM) capacitor, a transistor gate capacitor, a hybrid of metal and transistor capacitor; or a capacitor comprising paraelectric material.

Example 65: The apparatus of example 58, wherein the non-linear polar capacitor is positioned in a backend of a die, while the first and transistors are positioned in a frontend of a die.

Example 66: The apparatus of example 58, wherein the non-linear polar capacitor includes one of: a ferroelectric material, paraelectric material, or a non-linear dielectric.

Example 67: The apparatus of example 66, wherein the ferroelectric material includes one of: bismuth ferrite (BFO) or BFO with a first doping material where in the first doping material is one of lanthanum or elements from lanthanide series of periodic table; lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); perovskite ferroelectrics which include one of: BaTiO3, PbTiO3, KNbO3, or NaTaO3; hexagonal ferroelectric which includes one of: YMnO3 or LuFcO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), or yttrium (Y); nafnium (Hf), zirconium (Zr), aluminum (Al), silicon (Si), their oxides or their alloyed oxides; Hafnium oxides of the form. Hf1-x Ex Oy where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y) N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric includes one of: [PTO/STO]n or [LAO/STO]n, where 'n' is between 1 and 100.

Example 68: The apparatus of example 55, wherein the first, second, and third signals are analog signals, digital signals, or a combination of them.

Example 69: The apparatus of example 55, wherein the first, second, or third inversion logics comprise one of: a buffer, a CMOS inverter, an NAND gate, or an NOR gate.

Example 70: The apparatus of example 55 comprises: a first driver to generate the first input; and a second driver to generate the second input.

Example 71: An apparatus comprising: a first 3-input majority gate to perform a majority function on a first input, a second input and a carry-in input; a second 3-input majority gate to perform a majority function on the first input, the second input, and an inverse of the carry-in input; and a third 3-input majority gate to perform a majority function on an inverse output of the first 3-input majority gate, a buffered output of the second 3-input majority gate, and the carry-in input, wherein each of the first, second, and third 3-input majority gates include a capacitor having non-linear polar material.

Example 72: The apparatus of example 71 comprising a reset mechanism to reset the capacitor having the non-linear polar material, wherein the reset mechanism resets the capacitor having the non-linear polar material in a reset phase prior to an evaluation phase.

Example 73: The apparatus of example 71 comprises: a first driver to generate the first input; and a second driver to generate the second input.

Example 74: The apparatus of example 71, wherein the first or second inputs are an analog signal, a digital signal, or a combination of them.

Example 75: The apparatus of example 71, wherein the non-linear polar material includes one of: a ferroelectric material, paraelectric material, or a non-linear dielectric.

Example 76: The apparatus of example 75, wherein the ferroelectric material includes one of: bismuth ferrite (BFO) or BFO with a first doping material where in the first doping material is one of lanthanum, or elements from lanthanide series of periodic table; lead zirconium titanate (PZT) or PZT with a second doping material, wherein the second doping material is one of La or Nb; a relaxor ferro-electric includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); perovskite ferroelectrics which include one of: BaTiO3, PbTiO3, KNbO3, or NaTaO3; a hexagonal ferroelectric which includes one of: YMnO3 or LuFeO3; hexagonal ferro-electrics of a type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides of the form. Hf1-x Ex Oy where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb (y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric which includes one of: [PTO/STO]n or [LAO/STO]n, where 'n' is between 1 and 100.

Example 77: A system comprising: a processor; a communication interface communicatively coupled to the processor; and a memory coupled to the processor, wherein the processor comprises a serial adder which includes: a first 3-input majority gate to receive a first input, a second input, and a carry-in input; a first inversion logic having an input coupled to the carry-in input, and an output; a second 3-input majority gate to receive the first input, the second input, and the output of the first inversion logic; a second inversion logic having an input coupled to an output of the first 3-input majority gate, and an output; a non-inversion logic coupled to an output of the second 3-input majority gate; and a third 3-input majority gate to receive the output of the second inversion logic, the output of the non-inversion logic, and the carry-in input, wherein each of the first, second, and third 3-input majority gates include a capacitor having non-linear polar material.

Example 78: The system of example 77, wherein the processor is an artificial intelligence processor.

Example 79: The system of example 77, wherein the non-linear polar material includes one of: bismuth ferrite (BFO) or BFO with a first doping material where in the first doping material is one of lanthanum or elements from lanthanide series of periodic table; lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); perovskite includes one of: BaTiO3, PbTiO3, KNbO3, or NaTaO3; hexagonal ferroelectric which includes one of: YMnO3 or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides of the form, Hf1-x Ex Oy where E can be Al, Ca, Ce, Dy, Er, Gd, Ge, La, Sc, Si, Sr, Sn, or Y; Al(1-x)Sc(x)N, Ga(1-x)Sc(x)N, Al(1-x)Y(x) N or Al(1-x-y)Mg(x)Nb (y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, potassium strontium niobate; or an improper ferroelectric which includes one of: [PTO/STO]n or [LAO/STO]n, where 'n' is between 1 and 100.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method comprising:

forming a plurality of majority gates coupled together as a 1-bit full-adder, wherein an individual majority gate includes non-linear polar material and a plurality of inputs;

forming a plurality of driver circuitries coupled to the plurality of inputs;

forming a reset mechanism comprising a first set of devices coupled to outputs of the plurality of driver circuitries, and a second set of devices coupled to the non-linear polar material, wherein forming the reset mechanism further comprises:

forming a plurality of pass-gates coupled to the outputs of the plurality of driver circuitries; and forming a plurality of pull-down devices coupled to the plurality of pass-gates and the plurality of inputs, wherein the first set of devices includes the plurality of pass-gates and the plurality of pull-down devices;

controlling an individual pass-gate by a first control input and a second control input, wherein the second control input is an inverse of the first control input;

coupling an individual pull-down device to the individual pass-gate;

controlling the individual pull-down device by the first control input; and coupling second pull-down devices to either terminal of a capacitor having the non-linear polar material;

wherein the second pull-down devices include a first transistor controllable by the first control input, and a second transistor controllable by a third control input, and wherein the second set of devices includes the second pull-down devices.

2. The method of claim 1, wherein the forming the reset mechanism comprises forming the second set of devices include:

coupling a pull-up device to a first terminal of the capacitor;

coupling the first terminal to an output of the plurality of majority gates; and controlling the pull-up device by fourth control input.

3. The method of claim 2 further comprises operating the reset mechanism in four phases in a sequence.

4. The method of claim 3, wherein operating the reset mechanism comprises initializing, in a first phase of the four phases, input capacitors of the plurality of majority gates by controlling the first control input and the second control input.

5. The method of claim 4, wherein operating the reset mechanism comprises initializing, in a second phase of the four phases, the capacitor having the non-linear polar material by controlling the fourth control input.

6. The method of claim 5, wherein operating the reset mechanism comprises initializing, in a third phase of the four phases, the capacitor having the non-linear polar material by controlling the first control input, the third control input, and the fourth control input.

7. The method of claim 6, wherein operating the reset mechanism comprises opening, in a fourth phase of the four phases, the plurality of pass-gates by controlling the first control input and the second control input and disabling other devices of the first set of devices and the second set of devices.

8. The method of claim 1, wherein operating the reset mechanism comprises initializing nodes of the individual majority gate to 0V.

9. The method of claim 1, wherein the plurality of inputs includes a first input, a second input, and a carry-in input, and wherein forming the plurality of majority gates includes:

receiving, by a first 3-input majority gate, the first input, the second input, and the carry-in input;

coupling an input of a first inversion logic to the carry-in input and an output;

receiving, by a second 3-input majority gate, the first input, the second input, and the output of the first inversion logic;

coupling an input of a second inversion logic to an output of the first 3-input majority gate and an output;

coupling a non-inversion logic to an output of the second 3-input majority gate; and receiving, by a third 3-input majority gate, the output of the second inversion logic, the output of the non-inversion logic, and the carry-in input, wherein an individual one of the first, second, and third 3-input majority gates include a capacitor having the non-linear polar material.

10. The method of claim 9, wherein forming the plurality of majority gates includes:

coupling an input of a third inversion logic to the output of the second inversion logic;

providing, by the third inversion logic, an output which is a carry-out.

11. The method of claim 10, wherein the non-inversion logic is a first non-inversion logic, and wherein the method comprises coupling a second non-inversion logic to an output of the third 3-input majority gate.

12. The method of claim 1, wherein the non-linear polar material includes one of: a ferroelectric material, a paraelectric material, or a non-linear dielectric.

13. The method of claim 12, wherein the ferroelectric material includes one of:

bismuth ferrite (BFO) with a first doping material, wherein the first doping material is one of lanthanum or elements from lanthanide series of periodic table;

lead zirconium titanate (PZT) or PZT with a second doping material, wherein the second doping material is one of La or Nb;

a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);

a perovskite ferroelectric which includes one of: $BaTiO_3$, $PbTiO_3$, $KNbO_3$, or $NaTaO_3$;

a first hexagonal ferroelectric which includes one of: $YMnO_3$ or $LuFeO_3$;

a second hexagonal ferroelectric of a type h-$RMnO_3$, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

hafnium (Hf), zirconium (Zr), aluminum (Al), silicon (Si), their oxides, or their alloyed oxides;

hafnium oxides as $Hf_{(1-x)}E_{(x)}O_{(y)}$ where E includes one of: Al, Ca, Ce, Dy, Er, Gd, Ge, La, Sc, Si, Sr, Sn, or Y, wherein x and y are first and second fractions, respectively;

$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein x and y are third and fourth fractions, respectively;

y doped $HfO_2$, where y includes one of: Al, Ca, Ce, Dy, Er, Gd, Ge, La, Sc, Si, Sr, Sn, or Y;

niobate type compounds $LiNbO_3$, $LiTaO_3$, lithium iron tantalum oxy fluoride, barium strontium niobate, sodium barium niobate, or potassium strontium niobate; or an improper ferroelectric which includes one of: [PTO/STO]n or [LAO/STO]n, where 'n' is between 1 and 100.

14. A method comprising:

forming a reset mechanism comprising a first set of devices coupled to outputs of a plurality of driver circuitries, and a second set of devices coupled to a non-linear polar material, wherein forming the reset mechanism further comprises;

forming a plurality of pass-gates coupled to the outputs of the plurality of driver circuitries;

forming a plurality of pull-down devices coupled to the plurality of pass-gates and a plurality of inputs, wherein the first set of devices includes the plurality of pass-gates and the plurality of pull-down devices;

controlling an individual pass-gate i by a first control input and a second control input, wherein the second control input is an inverse of the first control input;

coupling an individual pull-down device to the individual pass-gate;

controlling the individual pull-down device by the first control input; and coupling second pull-down devices to either terminal of a capacitor having the non-linear polar material;

wherein the second pull-down devices include a first transistor controllable by the first control input, and a second transistor controllable by a third control input, and wherein the second set of devices includes the second pull-down devices.

15. A method comprising:

forming a processor circuitry;

coupling a communication interface to the processor circuitry; and forming a memory;

coupling the method to the processor circuitry, wherein forming the processor circuitry comprises:

forming a plurality of majority gates coupled together as a 1-bit full-adder, wherein an individual majority gate includes non-linear polar material, wherein the individual majority gate includes a plurality of inputs;

forming a plurality of driver circuitries coupled to the plurality of inputs; and forming a reset mechanism comprising a first set of devices coupled to outputs of the plurality of driver circuitries, and a second set of devices coupled to the non-linear polar material, wherein forming the reset mechanism further comprises forming a plurality of pass-gates coupled to the outputs of the plurality of driver circuitries;

forming a plurality of pull-down devices coupled to the plurality of pass-gates and a plurality of inputs, wherein the first set of devices includes the plurality of pass-gates and the plurality of pull-down devices;

controlling an individual pass-gate i by a first control input and a second control input, wherein the second control input is an inverse of the first control input;

coupling an individual pull-down device to the individual pass-gate;

controlling the individual pull-down device by the first control input;

coupling second pull-down devices to either terminal of a capacitor having the non-linear polar material;

wherein the second pull-down devices include a first transistor controllable by the first control input, and a second transistor controllable by a third control input, and wherein the second set of devices includes the second pull-down devices.

* * * * *